(12) United States Patent
Satou

(10) Patent No.: US 12,438,513 B2
(45) Date of Patent: Oct. 7, 2025

(54) FILTER

(71) Applicant: Murata Manufacturing Co., Ltd., Nagaokakyo (JP)

(72) Inventor: Takuya Satou, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 206 days.

(21) Appl. No.: 18/238,768

(22) Filed: Aug. 28, 2023

(65) Prior Publication Data

US 2023/0402985 A1 Dec. 14, 2023

Related U.S. Application Data

(63) Continuation of application No. PCT/JP2022/006799, filed on Feb. 19, 2022.

(30) Foreign Application Priority Data

Mar. 12, 2021 (JP) .................................. 2021-040872
Apr. 24, 2021 (JP) .................................. 2021-073706

(51) Int. Cl.
*H03H 7/09* (2006.01)
*H03H 7/01* (2006.01)

(52) U.S. Cl.
CPC ............ *H03H 7/09* (2013.01); *H03H 7/0115* (2013.01)

(58) Field of Classification Search
CPC ........... H03H 7/00; H03H 7/09; H03H 7/0115
USPC ................................................. 333/175–185
See application file for complete search history.

(56) References Cited

U.S. PATENT DOCUMENTS

| 12,244,287 B2 * | 3/2025 | Sato .................... H03H 7/42 |
| 12,278,609 B2 * | 4/2025 | Ogawa ................ H03H 7/0161 |
| 2007/0176712 A1 | 8/2007 | Tomaki et al. |
| 2010/0039189 A1 | 2/2010 | Taniguchi |

FOREIGN PATENT DOCUMENTS

| JP | 2003133805 A | 5/2003 |
| JP | 2007208395 A | 8/2007 |
| JP | 4784017 B2 | 9/2011 |
| WO | 2008143071 A1 | 11/2008 |

OTHER PUBLICATIONS

International Search Report in PCT/JP2022/006799, mailed May 17, 2022, 3 pages.
Written Opinion in PCT/JP2022/006799, mailed May 17, 2022, 3 pages.

* cited by examiner

Primary Examiner — Hai L Nguyen
(74) Attorney, Agent, or Firm — Keating & Bennett, LLP

(57) ABSTRACT

A filter includes a first input/output terminal, a second input/output terminal, a third input/output terminal, a fourth input/output terminal, a first stage resonant circuit connected between the first input/output terminal and the second input/output terminal, at least one intermediate stage resonant circuit, and a final stage resonant circuit connected between the third input/output terminal and the fourth input/output terminal. The first stage resonant circuit and the final stage resonant circuit each include an inductor. The at least one intermediate stage resonant circuit includes an inductor and a capacitor connected in parallel to each other, and one end of the inductor and one end of the capacitor connected in parallel to the inductor are connected to a reference potential.

19 Claims, 18 Drawing Sheets

FILTER

CROSS REFERENCE TO RELATED APPLICATIONS

This application claims the benefit of priority to Japanese Patent Application No. 2021-073706 filed on Apr. 24, 2021 and Japanese Patent Application No. 2021-040872 filed on Mar. 12, 2021, and is a Continuation application of PCT Application No. PCT/JP2022/006799 filed on Feb. 19, 2022. The entire contents of each application are hereby incorporated herein by reference.

BACKGROUND OF THE INVENTION

1. Field of the Invention

The present invention relates to a filter including a pair of balanced input/output terminals and another pair of balanced input/output terminals. The present invention also relates to a multilayer type filter including a pair of balanced input/output terminals, another pair of balanced input/output terminals, and a multilayer body including multiple dielectric layers.

2. Description of the Related Art

A reference filter is disclosed in Japanese Unexamined Patent Application Publication No. 2007-208395. In the filter of Japanese Unexamined Patent Application Publication No. 2007-208395, multiple λ/2 resonators are provided between an unbalanced input/output terminal and a pair of balanced input/output terminals.

The filter of Japanese Unexamined Patent Application Publication No. 2007-208395 is a filter having a balanced input and an unbalanced output or a filter having an unbalanced input and a balanced output.

Another filter is disclosed in Japanese Patent No. 4784017. In the filter of Japanese Patent No. 4784017, two low pass filters are formed in one multilayer body.

The filter of Japanese Patent No. 4784017 has a feature that when a signal passes through one low pass filter, the other low pass filter can be used as a ground, so that the ground can be omitted.

SUMMARY OF THE INVENTION

Since the filter of Japanese Unexamined Patent Application Publication No. 2007-208395 is a filter having a balanced input and an unbalanced output or a filter having an unbalanced input and a balanced output, there is a problem that a differential-mode signal, composed of two signals with phases different from each other by 180 degrees, cannot pass through as it is.

Further, since the filter of Japanese Unexamined Patent Application Publication No. 2007-208395 includes multiple λ/2 resonators, there is a problem to have a large size. That is, since a line length of the λ/2 resonator is longer than a line length of a λ/4 resonator, there is a problem that the size of the filter becomes large.

On the other hand, in the filter of Japanese Patent No. 4784017, since two low pass filters are formed in one multilayer body, a differential-mode signal is allowed to pass through. However, the filter of Japanese Patent No. 4784017 has a problem that not only the differential-mode signal but also a common-mode signal composed of two signals with the same phase passes through. Generally, in a filter including a pair of balanced input/output terminals and another pair of balanced input/output terminals, it is expected that the differential-mode signal passes through and the common-mode signal is prevented from passing through. However, in the filter of Japanese Patent No. 4784017, since two low pass filters are simply formed in one multilayer body, there is a problem that even the common-mode signal passes through.

Therefore, preferred embodiments of the present invention provide filters through each of which a differential-mode signal passes and a common-mode signal is prevented from passing. Other preferred embodiments of the present invention provide multilayer type filters which can be reduced in size.

A filter according to a preferred embodiment of the present invention includes a first input/output terminal, a second input/output terminal, a third input/output terminal, a fourth input/output terminal, a first stage resonant circuit connected between the first input/output terminal and the second input/output terminal, at least one intermediate stage resonant circuit, and a final stage resonant circuit connected between the third input/output terminal and the fourth input/output terminal. The first stage resonant circuit and the final stage resonant circuit each include an inductor, and the at least one intermediate stage resonant circuit includes an inductor and a capacitor connected in parallel to each other, and one end of the inductor and one end of the capacitor connected in parallel to the inductor are connected to a reference potential.

Filters according to preferred embodiments of the present invention allow a differential-mode signal to pass through, but prevent a common-mode signal from passing through.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
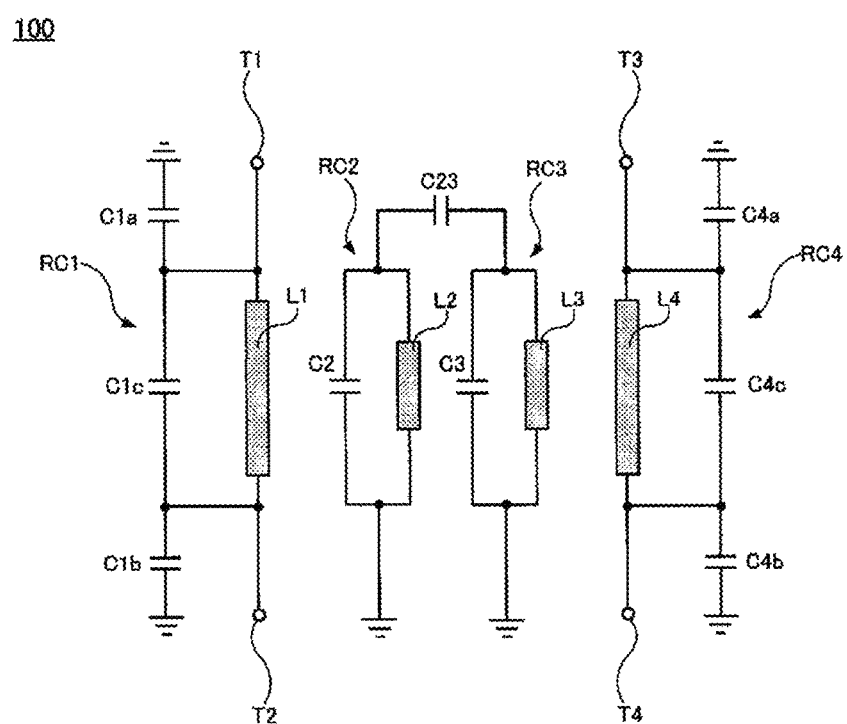
FIG. 1 is an equivalent circuit diagram of a filter according to a first preferred embodiment of the present invention.

Hereinafter, preferred embodiments of the present invention will be described with reference to the drawings.

It should be noted that each preferred embodiment exemplifies an aspect of an implementation of the present invention, and the present invention is not limited to the contents of the preferred embodiments and modifications or combinations thereof. Contents described in different preferred embodiments can be combined to be implemented, and the implemented contents in that case are also included in the present invention. Further, the drawings are intended to facilitate understanding of the description, and may be schematically drawn, so that a ratio of sizes of elements drawn or between elements does not necessarily coincide with a ratio of sizes of those described in the description in some cases. Furthermore, there are cases that a element described in the description is omitted in the drawing, a case that the number of elements is decreased, and the like.

First Preferred Embodiment

A filter 100 according to a first preferred embodiment of the present invention is illustrated in FIG. 1. Note that FIG. 1 is an equivalent circuit diagram of the filter 100.

The filter 100 includes a first input/output terminal T1, a second input/output terminal T2, a third input/output terminal T3, and a fourth input/output terminal T4. The first input/output terminal T1 is one of a pair of balanced input/output terminals, and the second input/output terminal T2 is the other of the pair of balanced input/output terminals. The third input/output terminal T3 is one of the other pair of balanced input/output terminals, and the fourth input/output terminal T4 is the other of the pair of balanced input/output terminals. The filter 100 includes a first resonant circuit RC1, a second resonant circuit RC2, a third resonant circuit RC3, a fourth resonant circuit RC4, and a capacitor C23. The first resonant circuit RC1 is a first stage resonant circuit. The second resonant circuit RC2 and the third resonant circuit RC3 each are intermediate stage resonant circuits. The fourth resonant circuit RC4 is a final stage resonant circuit.

The first resonant circuit RC1 is connected between the first input/output terminal T1 and the second input/output terminal T2. The first resonant circuit RC1 includes an inductor L1. In the present preferred embodiment, a line length of the inductor L1 is $\lambda/2$, for example. The inductor L1 having a line length of $\lambda/2$ may be regarded as a $\lambda/2$ resonator. Note that the line length of the inductor L1 is not limited to $\lambda/2$.

One end of the inductor L1 is connected to a reference potential via a capacitor C1a. The other end of the inductor L1 is connected to the reference potential via a capacitor C1b. In the present preferred embodiment, a ground is used as the reference potential. Note that the reference potential is not limited to the ground.

A capacitor C1c is connected between the capacitor C1a and the capacitor C1b. The capacitor C1c is provided to adjust the capacitance of the capacitor C1a and/or the capacitor C1b. The capacitor C1c may be omitted.

The second resonant circuit RC2 includes an inductor L2 and a capacitor C2 connected in parallel to each other. In the present preferred embodiment, a line length of the inductor L2 is $\lambda/4$, for example. The inductor L2 having the line length of $\lambda/4$ may be regarded as a $\lambda/4$ resonator. Note that the line length of the inductor L2 is not limited to $\lambda/4$.

One end of the inductor L2 and one end of the capacitor C2 are connected to the reference potential.

The third resonant circuit RC3 includes an inductor L3 and a capacitor C3 connected in parallel to each other. In the present preferred embodiment, a line length of the inductor L3 is $\lambda/4$, for example. The inductor L3 having the line length of $\lambda/4$ may be regarded as a $\lambda/4$ resonator. Note that the line length of the inductor L3 is not limited to $\lambda/4$.

One end of the inductor L3 and one end of the capacitor C3 are connected to the reference potential.

The other end of the inductor L2 and the other end of the capacitor C2 are connected to one end of the capacitor C23. The other end of the inductor L3 and the other end of the capacitor C3 are connected to the other end of the capacitor C23. Therefore, the inductor L2 and the capacitor C2 are connected to the inductor L3 and the capacitor C3 via the capacitor C23.

The fourth resonant circuit RC4 is connected between the third input/output terminal T3 and the fourth input/output terminal T4. The fourth resonant circuit RC4 includes an inductor L4. In the present preferred embodiment, a line length of the inductor L4 is $\lambda/2$, for example. The inductor L4 having the line length of $\lambda/2$ may be regarded as a $\lambda/2$ resonator. Note that the line length of the inductor L4 is not limited to $\lambda/2$.

One end of the inductor L4 is connected to the reference potential via a capacitor C4a. The other end of the inductor L4 is connected to the reference potential via a capacitor C4b.

A capacitor C4c is connected between the capacitor C4a and the capacitor C4b. The capacitor C4c is provided to adjust the capacitance of the capacitor C4a and/or the capacitor C4b. The capacitor C4c may be omitted.

Coupling relationships of main resonant circuits in the filter 100 will be described.

The inductor L1 of the first resonant circuit RC1 and the inductor L2 of the second resonant circuit RC2 are magnetically coupled. As a result, the first resonant circuit RC1 and the second resonant circuit RC2 are electromagnetically coupled.

The inductor L2 of the second resonant circuit RC2 and the inductor L3 of the third resonant circuit RC3 are magnetically coupled. Further, the second resonant circuit RC2 and the third resonant circuit RC3 are capacitively coupled by the capacitance of the capacitor C23. As a result, the second resonant circuit RC2 and the third resonant circuit RC3 are electromagnetically coupled.

The inductor L3 of the third resonant circuit RC3 and the inductor L4 of the fourth resonant circuit RC4 are magnetically coupled. As a result, the third resonant circuit RC3 and the fourth resonant circuit RC4 are electromagnetically coupled.

Note that the coupling relationships of the main resonant circuits in the filter 100 have been described above, and resonant circuits may be coupled to each other in addition to the above.

The filter 100 is a multilayer type filter including a multilayer body 1 in which multiple dielectric layers 1a to 1h are laminated.

Figure 2:
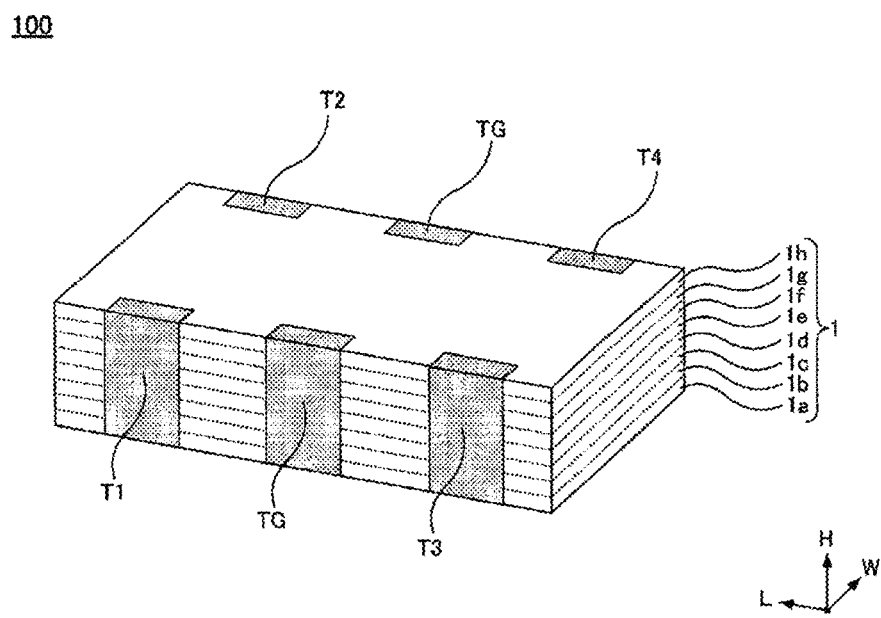
FIG. 2 is a perspective view of the filter according to the first preferred embodiment of the present invention.
Figure 3:
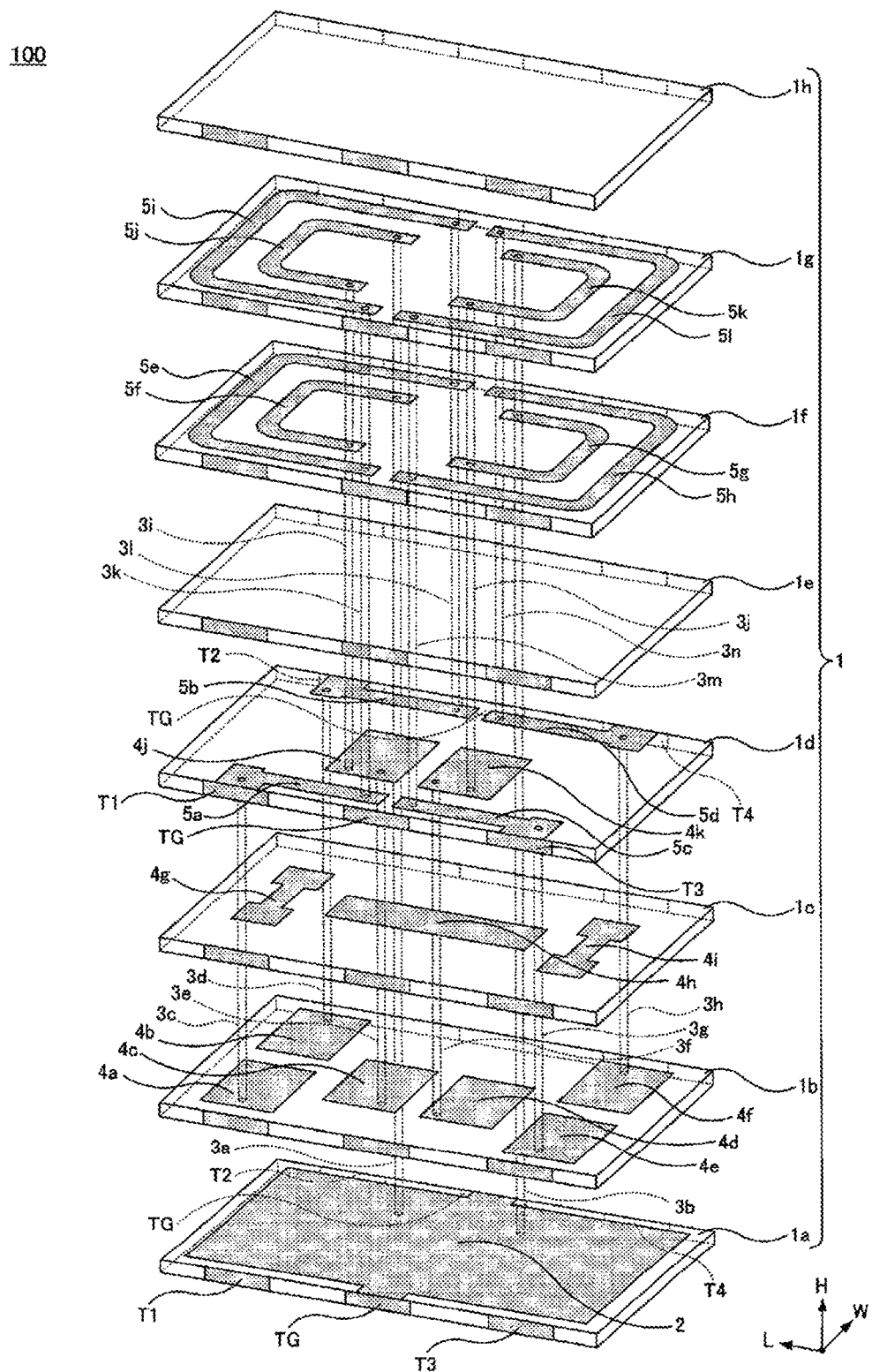
FIG. 3 is an exploded perspective view of the filter according to the first preferred embodiment of the present invention.

FIG. 2 is a perspective view of the filter 100. FIG. 3 is an exploded perspective view of the filter 100.

It is sufficient that the dielectric constant of the dielectric layers 1a to 1h is greater than the dielectric constant of air. Any material may be used for the dielectric layers 1a to 1h (multilayer body 1), and various dielectric materials such as ceramics and resin may be used.

The multilayer body 1 has a height direction H in which the dielectric layers 1a to 1h are laminated, a width direction W orthogonal to the height direction H, and a length direction L orthogonal to both the height direction H and the width direction W. The multilayer body 1 has a rectangular parallelepiped shape (including a cubic shape). Note that a size in the width direction W is equal to or less than a size in the length direction L.

The first input/output terminal T1, a ground terminal TG, and the third input/output terminal T3 are provided on one side surface, and the second input/output terminal T2, the ground terminal TG, and the fourth input/output terminal T4 are provided on the other side surface. The one side surface and the other side surface are opposed to each other in the width direction W of the multilayer body 1. Note that both end portions of each of the first input/output terminal T1, the second input/output terminal T2, the third input/output terminal T3, the fourth input/output terminal T4, and the two ground terminals TG extend to two surfaces of the multilayer body 1 opposed to each other in the height direction H, and are folded back.

The configuration of the dielectric layers 1a to 1h will be described with reference to FIG. 3. The multilayer body 1 includes via conductors 3a, 3b, 3c, 3d, 3e, 3f, 3g, 3h, 3i, 3j, 3k, 3l, 3m, and 3n.

In the dielectric layer 1a, the first input/output terminal T1, the ground terminal TG, and the third input/output terminal T3 are provided on one side surface, and the second input/output terminal T2, the ground terminal TG, and the fourth input/output terminal T4 are provided on the other side surface opposed to the one side surface in the width direction W.

In the dielectric layers 1b to 1h as well, the first input/output terminal T1, the ground terminal TG, and the third input/output terminal T3 are provided on one side surface, and the second input/output terminal T2, the ground terminal TG, and the fourth input/output terminal T4 are provided on the other side surface opposed to the one side surface in the width direction W. However, a description of these terminals and assignment of reference signs to the drawings may be omitted.

A ground conductor pattern 2 is provided on one of two surfaces of the dielectric layer 1a opposed to each other in the height direction H. The ground conductor pattern 2 is connected to the two ground terminals TG.

The via conductors 3a and 3b each penetrate through two surfaces of the dielectric layer 1b opposed to each other in the height direction H.

Capacitor conductor patterns 4a, 4b, 4c, 4d, 4e, and 4f are provided on one of two surfaces of the dielectric layer 1b opposed to each other in the height direction H.

The via conductors 3a, 3b, 3c, 3d, 3e, 3f, 3g, and 3h each penetrate through two surfaces of the dielectric layer 1c opposed to each other in the height direction H.

Capacitor conductor patterns 4g, 4h, and 4i are provided on one of two surfaces of the dielectric layer 1c opposed to each other in the height direction H.

The via conductors 3a, 3b, 3c, 3d, 3e, 3f, 3g, and 3h each penetrate through two surfaces of the dielectric layer 1d opposed to each other in the height direction H.

Capacitor conductor patterns 4j and 4k are provided on one of two surfaces of the dielectric layer 1d opposed to each other in the height direction H.

The capacitor conductor pattern 4j is connected to the capacitor conductor pattern 4c by the via conductor 3e.

The capacitor conductor pattern 4k is connected to the capacitor conductor pattern 4d by the via conductor 3f.

Line-shaped conductor patterns 5a, 5b, 5c, and 5d are provided on one of two surfaces of the dielectric layer 1d opposed to each other in the height direction H.

The line-shaped conductor pattern 5a is connected to the first input/output terminal T1. Further, the line-shaped conductor pattern 5a is connected to the capacitor conductor pattern 4a by the via conductor 3c. The capacitor conductor pattern 4a is connected to the first input/output terminal T1 through the via conductor 3c and the line-shaped conductor pattern 5a.

The line-shaped conductor pattern 5b is connected to the second input/output terminal T2. Further, the line-shaped conductor pattern 5b is connected to the capacitor conductor pattern 4b by the via conductor 3d. The capacitor conductor pattern 4b is connected to the second input/output terminal T2 through the via conductor 3d and the line-shaped conductor pattern 5b.

The line-shaped conductor pattern 5c is connected to the third input/output terminal T3. Further, the line-shaped conductor pattern 5c is connected to the capacitor conductor pattern 4e by the via conductor 3g. The capacitor conductor pattern 4e is connected to the third input/output terminal T3 through the via conductor 3g and the line-shaped conductor pattern 5c.

The line-shaped conductor pattern 5d is connected to the fourth input/output terminal T4. Further, the line-shaped conductor pattern 5d is connected to the capacitor conductor pattern 4f by the via conductor 3h. The capacitor conductor pattern 4f is connected to the fourth input/output terminal T4 through the via conductor 3h and the line-shaped conductor pattern 5d.

The via conductors 3a, 3b, 3i, 3j, 3k, 3l, 3m, and 3n each penetrate through two surfaces of the dielectric layer 1e opposed to each other in the height direction H.

No conductor pattern is provided on two surfaces of the dielectric layer 1e opposed to each other in the height direction H.

The via conductors 3a, 3b, 3i, 3j, 3k, 3l, 3m, and 3n each penetrate through two surfaces of the dielectric layer if opposed to each other in the height direction H.

A line-shaped conductor pattern 5e, a line-shaped conductor pattern 5f, a line-shaped conductor pattern 5g, and a line-shaped conductor pattern 5h are provided on one of two surfaces of the dielectric layer if opposed to each other in the height direction H. The line-shaped conductor patterns 5e to 5h each have a U-shape in plan view, and each include an arc-shaped portion and an opening-side portion including an end portion. In the line-shaped conductor patterns 5e to 5h, a direction from the arc-shaped portion toward the opening-side portion is defined as a length direction of the U-shape.

The line-shaped conductor pattern 5e is larger than the line-shaped conductor pattern 5f. The line-shaped conductor pattern 5e and the line-shaped conductor pattern 5f are aligned with each other in the length direction of the U-shape. The line-shaped conductor pattern 5f is disposed inside the line-shaped conductor pattern 5e.

The line-shaped conductor pattern 5h is larger than the line-shaped conductor pattern 5g. The line-shaped conductor pattern 5g and the line-shaped conductor pattern 5h are aligned with each other in the length direction of the U-shape. The line-shaped conductor pattern 5g is disposed inside the line-shaped conductor pattern 5h.

The opening-side portion of the line-shaped conductor pattern 5f and the opening-side portion of the line-shaped conductor pattern 5g are disposed to face each other. The opening-side portion of the line-shaped conductor pattern 5e and the opening-side portion of the line-shaped conductor pattern 5h are disposed to face each other.

When the multilayer body 1 is viewed in the height direction H, the line-shaped conductor pattern 5e, the line-shaped conductor pattern 5f, the line-shaped conductor pattern 5g, and the line-shaped conductor pattern 5h are disposed in this order along the length direction L of the multilayer body 1.

The line-shaped conductor pattern 5e is connected to the line-shaped conductor pattern 5a by the via conductor 3k. The line-shaped conductor pattern 5e is connected to the line-shaped conductor pattern 5b by the via conductor 3l.

The line-shaped conductor pattern 5f is connected to the capacitor conductor pattern 4j by the via conductor 3i. The line-shaped conductor pattern 5f is connected to the ground conductor pattern 2 by the via conductor 3a.

The line-shaped conductor pattern 5g is connected to the capacitor conductor pattern 4k by the via conductor 3j. The line-shaped conductor pattern 5g is connected to the ground conductor pattern 2 by the via conductor 3b.

The line-shaped conductor pattern 5h is connected to the line-shaped conductor pattern 5c by the via conductor 3m. The line-shaped conductor pattern 5h is connected to the line-shaped conductor pattern 5d by the via conductor 3n.

The via conductors 3a, 3b, 3i, 3j, 3k, 3l, 3m, and 3n each penetrate through two surfaces of the dielectric layer 1g opposed to each other in the height direction H.

A line-shaped conductor pattern 5i, a line-shaped conductor pattern 5j, a line-shaped conductor pattern 5k, and a line-shaped conductor pattern 5l are provided on one of two surfaces of the dielectric layer 1g opposed to each other in the height direction H. The line-shaped conductor patterns 5i to 5l each have a U-shape in plan view, and each include an arc-shaped portion and an opening-side portion including an end portion.

The line-shaped conductor pattern 5i is provided immediately above the line-shaped conductor pattern 5e in the height direction H, and preferably has the same or substantially the same shape and size as the line-shaped conductor pattern 5e. The line-shaped conductor pattern 5j is provided immediately above the line-shaped conductor pattern 5f in the height direction H, and preferably has the same or substantially the same shape and size as the line-shaped conductor pattern 5f. The line-shaped conductor pattern 5k is provided immediately above the line-shaped conductor pattern 5g in the height direction H, and preferably has the same or substantially the same shape and size as the line-shaped conductor pattern 5g. The line-shaped conductor pattern 5l is provided immediately above the line-shaped conductor pattern 5h in the height direction H, and preferably has the same or substantially the same shape and size as the line-shaped conductor pattern 5f.

That is, the line-shaped conductor patterns 5i, 5j, 5k, and 5l are respectively provided to overlap the line-shaped conductor patterns 5e, 5f, 5g, and 5h having the same shape and size in the height direction H. Therefore, the filter 100 has a high Q factor. Note that the line-shaped conductor patterns 5i, 5k, and 5l may be omitted in terms of an electric circuit.

The line-shaped conductor pattern 5i is connected to the line-shaped conductor pattern 5a by the via conductor 3k. The line-shaped conductor pattern 5i is connected to the line-shaped conductor pattern 5b by the via conductor 3l.

The line-shaped conductor pattern 5j is connected to the capacitor conductor pattern 4j by the via conductor 3i. The line-shaped conductor pattern 5j is connected to the ground conductor pattern 2 by the via conductor 3a.

The line-shaped conductor pattern 5k is connected to the capacitor conductor pattern 4k by the via conductor 3j. The line-shaped conductor pattern 5k is connected to the ground conductor pattern 2 by the via conductor 3b.

The line-shaped conductor pattern 5l is connected to the line-shaped conductor pattern 5c by the via conductor 3m. The line-shaped conductor pattern 5l is connected to the line-shaped conductor pattern 5d by the via conductor 3n.

The dielectric layer 1h is a protection layer. Although not illustrated, one of two surfaces of the dielectric layer 1h opposed to each other in the height direction H is provided with a direction mark indicating the disposition of the first input/output terminal T1, second input/output terminal T2, third input/output terminal T3, fourth input/output terminal T4, and the ground terminal TG.

The filter 100 has the structure described above.

Any material may be used for each of the first input/output terminal T1, the second input/output terminal T2, the third input/output terminal T3, the fourth input/output terminal T4, the ground terminal TG, the ground conductor pattern 2, the via conductors 3a to 3n, the capacitor conductor patterns 4a to 4k, and the line-shaped conductor patterns 5a to 5l, and various conductive materials may be used.

Next, a relationship of the equivalent circuit and the structure of the multilayer type filter 100 will be described.

The inductor L1 of the first resonant circuit RC1 includes a conductive path starting from the first input/output terminal T1, passing through the line-shaped conductor pattern 5a, the via conductor 3k, the line-shaped conductor patterns 5e and the via conductor 3l, and the line-shaped conductor pattern and ending at the second input/output terminal T2.

The capacitor C1a includes capacitance between the capacitor conductor pattern 4a and the ground conductor pattern 2. The capacitor conductor pattern 4a is connected to the first input/output terminal T1 through the via conductor 3c and the line-shaped conductor pattern 5a.

The capacitor C1b includes capacitance between the capacitor conductor pattern 4b and the ground conductor pattern 2. The capacitor conductor pattern 4b is connected to the second input/output terminal T2 through the via conductor 3d and the line-shaped conductor pattern 5b.

The capacitor C1c includes capacitance between the capacitor conductor pattern 4a and the capacitor conductor pattern 4g, and capacitance between the capacitor conductor pattern 4g and the capacitor conductor pattern 4b, which are connected in series.

The inductor L2 of the second resonant circuit RC2 includes a conductive path starting from the capacitor conductor pattern 4j, passing through the via conductor 3i, the line-shaped conductor patterns 5f and 5j, and the via conductor 3a, and ending at the ground conductor pattern 2.

The capacitor C2 of the second resonant circuit RC2 includes capacitance between the capacitor conductor pattern 4c and the ground conductor pattern 2. The capacitor conductor pattern 4c is connected to the capacitor conductor pattern 4j by the via conductor 3e.

The inductor L3 of the third resonant circuit RC3 includes a conductive path starting from the capacitor conductor pattern 4k, passing through the via conductor 3j, the line-shaped conductor patterns 5g and 5k, and the via conductor 3b, and ending at the ground conductor pattern 2.

The capacitor C3 of the third resonant circuit RC3 includes capacitance between the capacitor conductor pattern 4d and the ground conductor pattern 2. The capacitor conductor pattern 4d is connected to the capacitor conductor pattern 4k by the via conductor 3f.

The capacitor C23 includes capacitance between the capacitor conductor patterns 4c and 4j and the capacitor conductor pattern 4h, and capacitance between the capacitor conductor pattern 4h and the capacitor conductor patterns 4d and 4k, which are connected in series.

The inductor L4 of the fourth resonant circuit RC4 includes a conductive path starting from the third input/output terminal T3, passing through the line-shaped conductor pattern 5c, the via conductor 3m, the line-shaped conductor patterns 5h and 5l, the via conductor 3n, and the line-shaped conductor pattern and ending at the fourth input/output terminal T4.

The capacitor C4a includes capacitance between the capacitor conductor pattern 4e and the ground conductor pattern 2. The capacitor conductor pattern 4e is connected to the third input/output terminal T3 through the via conductor 3g and the line-shaped conductor pattern 5c.

The capacitor C4b includes capacitance between the capacitor conductor pattern 4f and the ground conductor pattern 2. The capacitor conductor pattern 4f is connected to the fourth input/output terminal T4 through the via conductor 3h and the line-shaped conductor pattern 5d.

The capacitor C4c includes capacitance between the capacitor conductor pattern 4e and the capacitor conductor pattern 4i, and capacitance between the capacitor conductor pattern 4i and the capacitor conductor pattern 4f, which are connected in series.

As described above, the filter 100 in FIG. 2 and FIG. 3 has the equivalent circuit illustrated in FIG. 1.

Figure 4A:
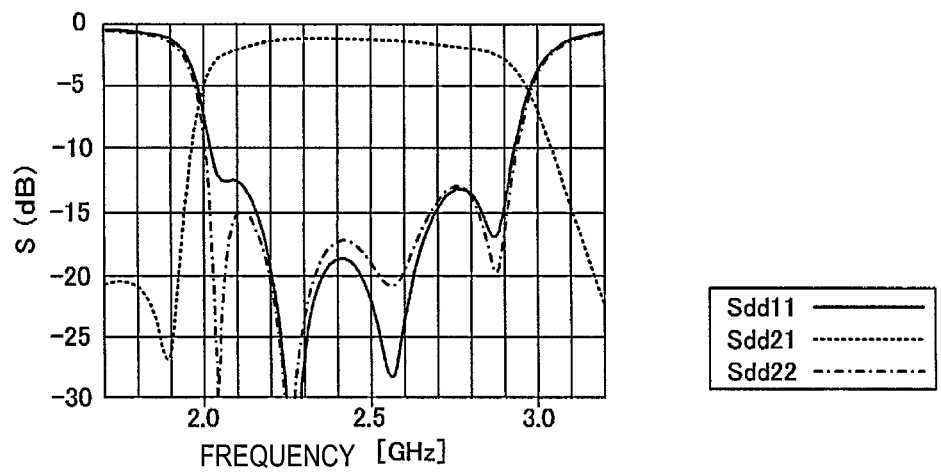
FIGS. 4A to 4C are graphs each illustrating characteristics of the filter according to the first preferred embodiment of the present invention.
Figure 4B:
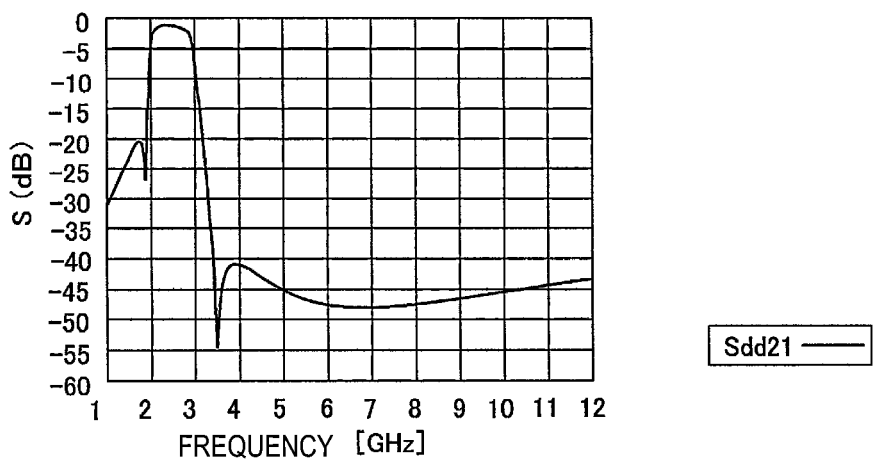
Figure 4C:
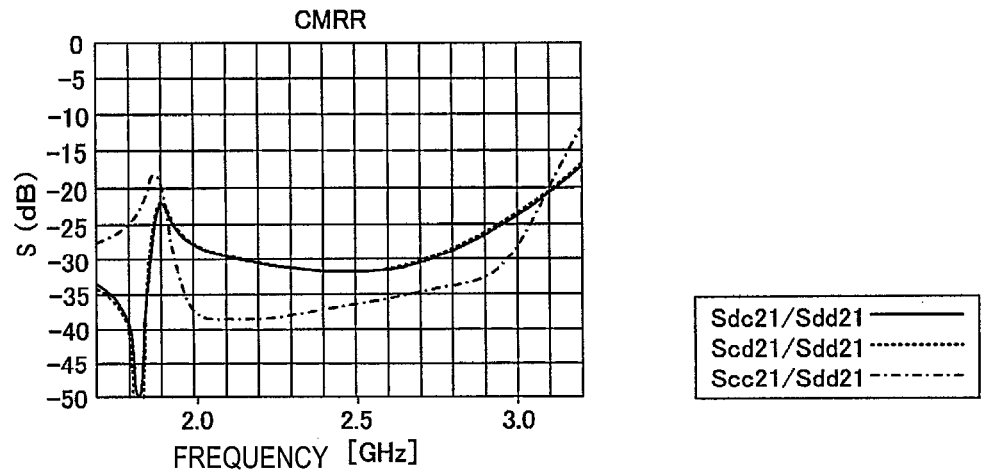

Characteristics of the filter 100 are illustrated in FIGS. 4A to 4C.

An Sdd11 characteristic, an Sdd21 characteristic, and an Sdd22 characteristic of the filter 100 are illustrated in FIG. 4A. The Sdd21 characteristic is a bandpass characteristic. The Sdd11 characteristic and the Sdd22 characteristic each are a reflection characteristic. The Sdd21 characteristic of the filter 100 over a wider frequency range is illustrated in FIG. 4B.

As can be seen from FIGS. 4A and 4B, the filter 100 has a preferable frequency characteristic as a band pass filter. Specifically, steep attenuation is obtained both on the low frequency side outside the pass band and on the high frequency side outside the pass band.

A CMRR characteristic of the filter 100 is illustrated in FIG. 4C. More specifically, an Sdc21/Sdd21 characteristic, an Scd21/Sdd21 characteristic, and an Scc21/Sdd21 characteristic of the filter 100 are illustrated.

As can be seen from the Sdc21/Sdd21 characteristic and the Scd21/Sdd21 characteristic, the filter 100 suppresses that a common-mode input signal is outputted as a differential-mode signal, or a differential-mode input signal is outputted as a common-mode signal.

Further, as can be seen from the Scc21/Sdd21 characteristic, the filter 100 preferably prevents a common-mode signal from passing through, while preferably allowing a differential-mode signal to pass through.

The filter 100 according to the first preferred embodiment has the following features.

As described above, the filter 100 preferably prevents the common-mode signal from passing through, while preferably allowing the differential-mode signal to pass through.

Since the line length of the inductor included in the intermediate stage resonant circuit is $\lambda/4$, for example, the filter 100 may be reduced in size.

In the filter 100, a small line-shaped conductor pattern with a U-shape included in the intermediate stage resonant circuit is disposed inside a large line-shaped conductor pattern with a U-shape included in the first stage resonant circuit and/or the final stage resonant circuit to be aligned with each other in a length direction of the U-shape. Thus, the surface of the dielectric layer on which the line-shaped conductor patterns are provided is effectively used. Therefore, the filter 100 may be reduced in size in planar directions (width direction×length direction).

Modification of First Preferred Embodiment: Filter 110

Figure 5:
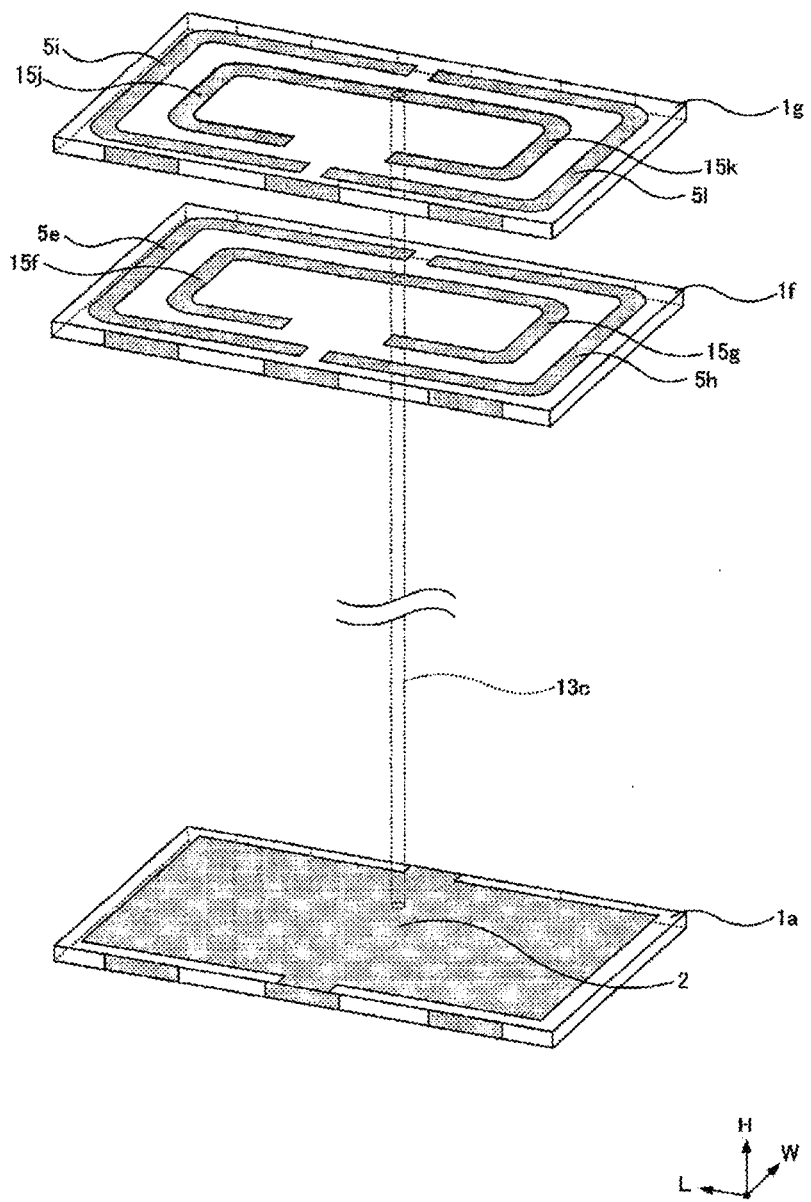
FIG. 5 is an exploded perspective view of a filter according to a modification of the first preferred embodiment of the present invention illustrating a main portion thereof.
Figure 6:
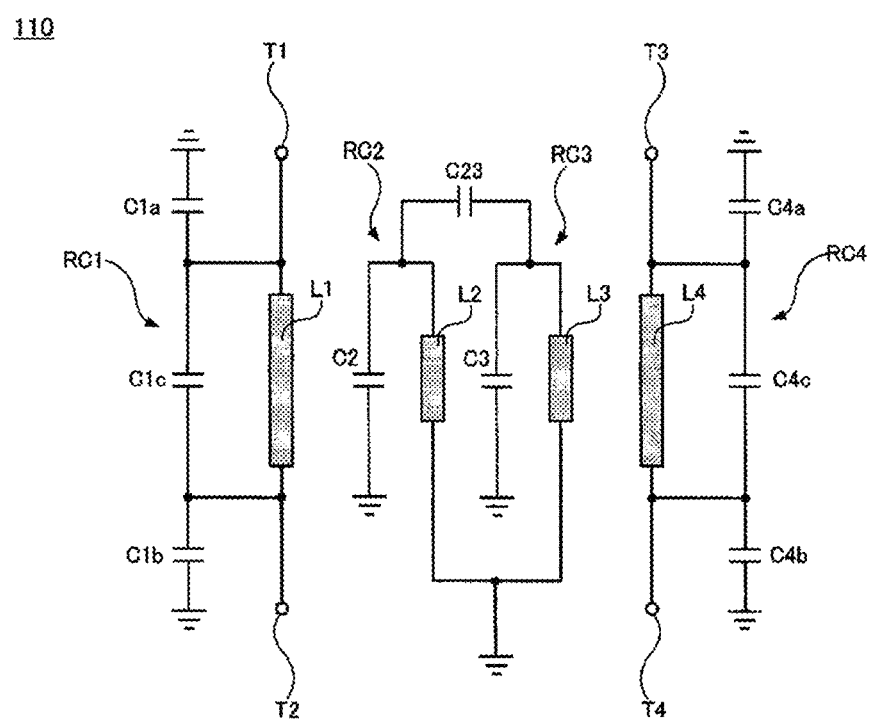
FIG. 6 is an equivalent circuit diagram of the filter according to the modification of the first preferred embodiment of the present invention.

A filter 110 according to a modification of the first preferred embodiment of the present invention is illustrated in FIG. 5 and FIG. 6. FIG. 5 is an exploded perspective view of the filter 110 illustrating a main portion thereof. FIG. 6 is an equivalent circuit diagram of the filter 110.

The filter 110 is obtained by changing a portion of the configuration of the filter 100. Specifically, in the filter 100, a set of the line-shaped conductor patterns 5f and 5j each provided to the dielectric layers 1f and 1g and a set of the line-shaped conductor patterns 5g and 5k each provided to the dielectric layers 1f and 1g are independent of each other. Then, the set of the line-shaped conductor patterns 5f and 5j is connected to the ground conductor pattern 2 by the via conductor 3a, and the set of the line-shaped conductor patterns 5g and 5k is connected to the ground conductor pattern 2 by the via conductor 3b. In the filter 110, line-shaped conductor patterns 15f and 15g are connected to each other, line-shaped conductor patterns 15j and 15k are connected to each other, and the connected conductor patterns above are connected to the ground conductor pattern 2 by a via conductor 13c.

In the filter 110, the magnetic coupling between the inductor L2 included in the second resonant circuit RC2 and the inductor L3 included in the third resonant circuit RC3 is stronger than that in the filter 100.

As described above, inductors included in the intermediate stage resonant circuit are connected to each other and are connected to the ground by a common via conductor. This makes the magnetic coupling between the inductors connected to each other strong. Then, the frequency characteristic of the filter may be adjusted.

Second Preferred Embodiment

Figure 7:
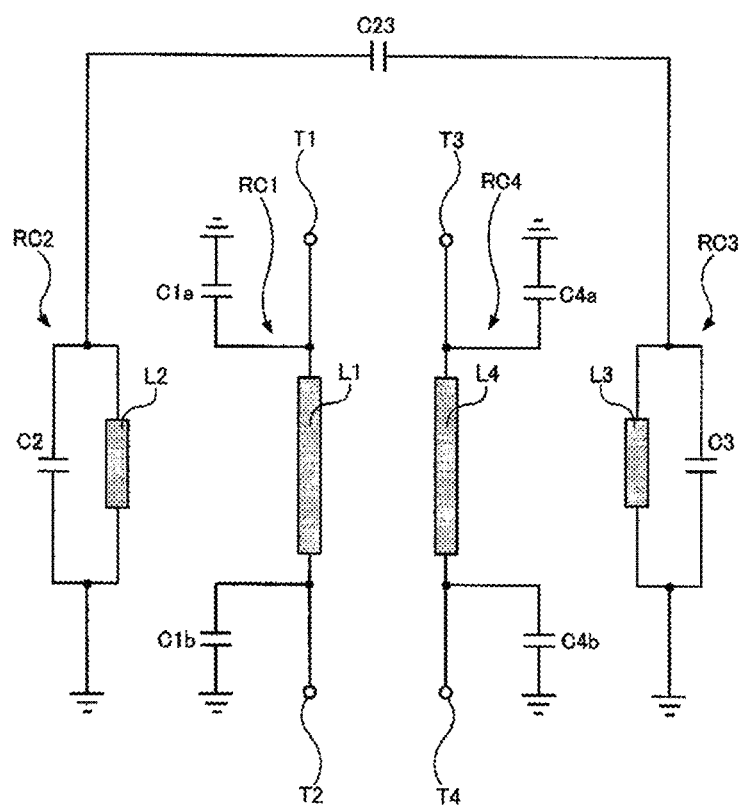
FIG. 7 is an equivalent circuit diagram of a filter according to a second preferred embodiment of the present invention.

A filter 200 according to a second preferred embodiment of the present invention is illustrated in FIG. 7. Note that FIG. 7 is an equivalent circuit diagram of the filter 200.

The filter 200 includes a first input/output terminal T1, a second input/output terminal T2, a third input/output terminal T3, and a fourth input/output terminal T4. The filter 200 includes a first resonant circuit RC1, a second resonant circuit RC2, a third resonant circuit RC3, a fourth resonant circuit RC4, and a capacitor C23.

The first resonant circuit RC1 is connected between the first input/output terminal T1 and the second input/output terminal T2. The first resonant circuit RC1 includes an inductor L1. In the present preferred embodiment, a line length of the inductor L1 is $\lambda/2$, for example.

One end of the inductor L1 is connected to a reference potential via a capacitor C1a. The other end of the inductor L1 is connected to the reference potential via a capacitor C1b. Note that, in the filter 200, the capacitor C1c included in the filter 100 according to the above-described first preferred embodiment is omitted.

The second resonant circuit RC2 includes an inductor L2 and a capacitor C2 connected in parallel to each other. In the present preferred embodiment, a line length of the inductor L2 is $\lambda/4$, for example.

One end of the inductor L2 and one end of the capacitor C2 are connected to the reference potential.

The third resonant circuit RC3 includes an inductor L3 and a capacitor C3 connected in parallel to each other. In the present preferred embodiment, a line length of the inductor L3 is $\lambda/4$, for example.

One end of the inductor L3 and one end of the capacitor C3 are connected to the reference potential.

The other end of the inductor L2 and the other end of the capacitor C2 are connected to one end of the capacitor C23. The other end of the inductor L3 and the other end of the capacitor C3 are connected to the other end of the capacitor C23. Therefore, the inductor L2 and the capacitor C2 are connected to the inductor L3 and the capacitor C3 via the capacitor C23.

The fourth resonant circuit RC4 is connected between the third input/output terminal T3 and the fourth input/output terminal T4. The fourth resonant circuit RC4 includes an inductor L4. In the present preferred embodiment, a line length of the inductor L4 is $\lambda/2$, for example.

One end of the inductor L4 is connected to the reference potential via a capacitor C4a. The other end of the inductor L4 is connected to the reference potential via a capacitor C4b. Note that, in the filter 200, the capacitor C4c included in the filter 100 according to the above-described first preferred embodiment is omitted.

Coupling relationships of main resonant circuits in the filter 200 will be described.

The inductor L1 of the first resonant circuit RC1 and the inductor L2 of the second resonant circuit RC2 are magnetically coupled. As a result, the first resonant circuit RC1 and the second resonant circuit RC2 are electromagnetically coupled.

The second resonant circuit RC2 and the third resonant circuit RC3 are capacitively coupled by the capacitance of the capacitor C23. As a result, the second resonant circuit RC2 and the third resonant circuit RC3 are electromagnetically coupled.

The inductor L3 of the third resonant circuit RC3 and the inductor L4 of the fourth resonant circuit RC4 are magnetically coupled. As a result, the third resonant circuit RC3 and the fourth resonant circuit RC4 are electromagnetically coupled.

The inductor L1 of the first resonant circuit RC1 and the inductor L4 of the fourth resonant circuit RC4 are magnetically coupled. As a result, the first resonant circuit RC1 and the fourth resonant circuit RC4 are electromagnetically coupled.

Note that the coupling relationships of the main resonant circuits in the filter 200 have been described above, and resonant circuits may be coupled to each other in addition to the above.

The filter 200 is a multilayer type filter including a multilayer body 1 in which multiple dielectric layers 1a to 1i are laminated.

Figure 8:
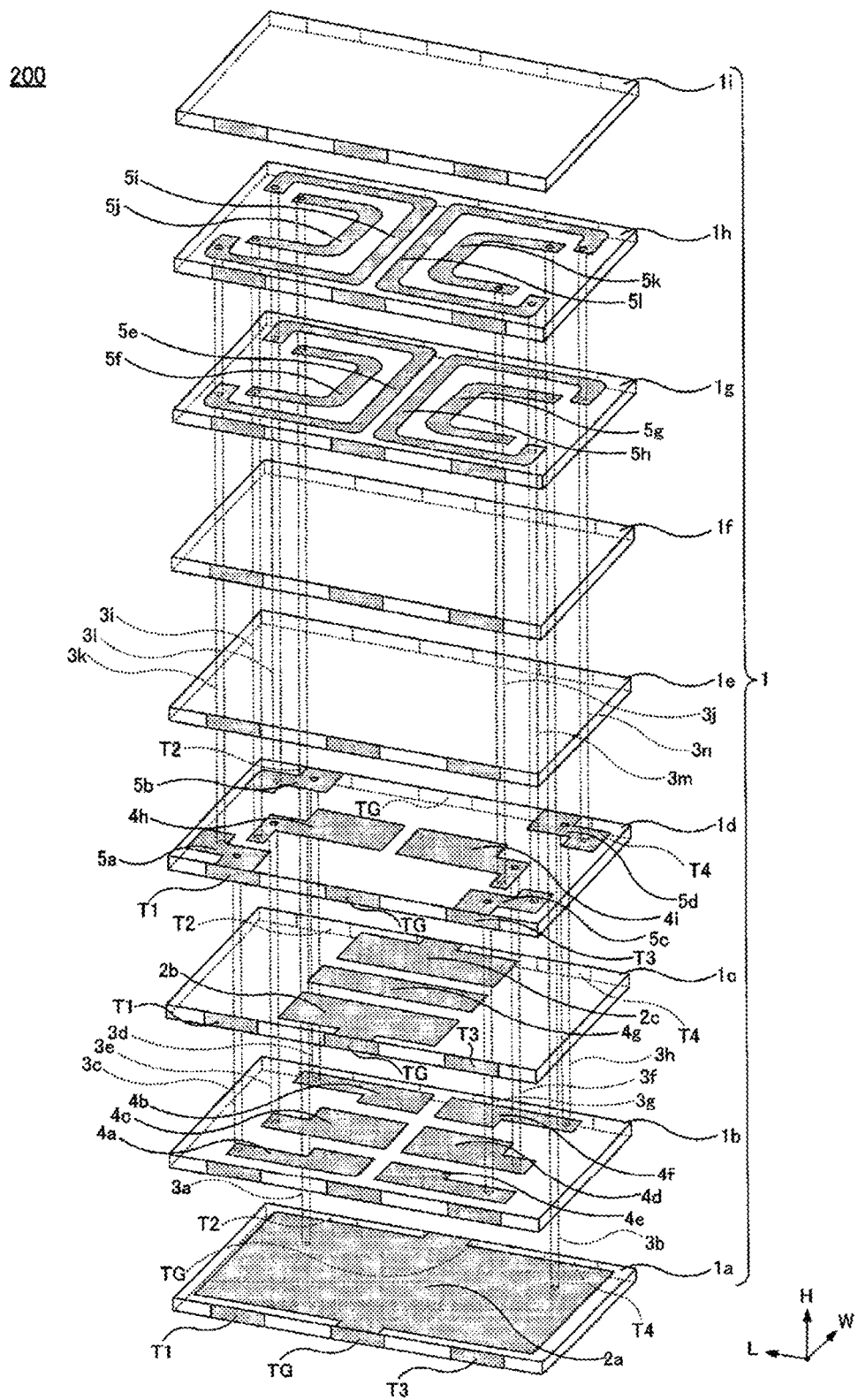
FIG. 8 is an exploded perspective view of the filter according to the second preferred embodiment of the present invention.

FIG. 8 is an exploded perspective view of the filter 200.

The first input/output terminal T1, a ground terminal TG, and the third input/output terminal T3 are provided on one side surface, and the second input/output terminal T2, the ground terminal TG, and the fourth input/output terminal T4 are provided on the other side surface. The one side surface and the other side surface are opposed to each other in a width direction W of the multilayer body 1.

The configuration of the dielectric layers 1a to 1i will be described with reference to FIG. 8. The multilayer body 1 includes via conductors 3a, 3b, 3c, 3d, 3e, 3f, 3g, 3h, 3i, 3j, 3k, 3l, 3m, and 3n.

In the dielectric layer 1a, the first input/output terminal T1, the ground terminal TG, and the third input/output terminal T3 are provided on one side surface, and the second input/output terminal T2, the ground terminal TG, and the fourth input/output terminal T4 are provided on the other side surface opposed to the one side surface in the width direction W. In the dielectric layers 1b to 1i as well, the first input/output terminal T1, the ground terminal TG, and the third input/output terminal T3 are provided on one side surface, and the second input/output terminal T2, the ground terminal TG, and the fourth input/output terminal T4 are provided on the other side surface opposed to the one side surface in the width direction W.

A ground conductor pattern 2a is provided on one of two surfaces of the dielectric layer 1a opposed to each other in a height direction H. The ground conductor pattern 2a is connected to the two ground terminals TG.

The via conductors 3a and 3b each penetrate through two surfaces of the dielectric layer 1b opposed to each other in the height direction H.

Capacitor conductor patterns 4a, 4b, 4c, 4d, 4e, and 4f are provided on one of two surfaces of the dielectric layer 1b opposed to each other in the height direction H.

The via conductors 3a, 3b, 3c, 3d, 3e, 3f, 3g, and 3h each penetrate through two surfaces of the dielectric layer 1c opposed to each other in the height direction H.

Ground conductor patterns 2b and 2c and the capacitor conductor pattern 4g are provided on one of two surfaces of the dielectric layer 1c opposed to each other in the height direction H. The ground conductor pattern 2b is connected to one ground terminal TG. The ground conductor pattern 2c is connected to the other ground terminal TG.

The via conductors 3a, 3b, 3c, 3d, 3e, 3f, 3g, and 3h each penetrate through two surfaces of the dielectric layer 1d opposed to each other in the height direction H.

The capacitor conductor patterns 4h and 4i are provided on one of two surfaces of the dielectric layer 1d opposed to each other in the height direction H.

The capacitor conductor pattern 4h is connected to the capacitor conductor pattern 4c by the via conductor 3e.

The capacitor conductor pattern 4i is connected to the capacitor conductor pattern 4d by the via conductor 3f.

Line-shaped conductor patterns 5a, 5b, 5c, and 5d are provided on one of two surfaces of the dielectric layer 1d opposed to each other in the height direction H.

The line-shaped conductor pattern 5a is connected to the first input/output terminal T1. Further, the line-shaped conductor pattern 5a is connected to the capacitor conductor pattern 4a by the via conductor 3c. The capacitor conductor pattern 4a is connected to the first input/output terminal T1 through the via conductor 3c and the line-shaped conductor pattern 5a.

The line-shaped conductor pattern 5b is connected to the second input/output terminal T2. Further, the line-shaped conductor pattern 5b is connected to the capacitor conductor pattern 4b by the via conductor 3d. The capacitor conductor pattern 4b is connected to the second input/output terminal T2 through the via conductor 3d and the line-shaped conductor pattern 5b.

The line-shaped conductor pattern 5c is connected to the third input/output terminal T3. Further, the line-shaped conductor pattern 5c is connected to the capacitor conductor pattern 4e by the via conductor 3g. The capacitor conductor pattern 4e is connected to the third input/output terminal T3 through the via conductor 3g and the line-shaped conductor pattern 5c.

The line-shaped conductor pattern 5d is connected to the fourth input/output terminal T4. Further, the line-shaped conductor pattern 5d is connected to the capacitor conductor pattern 4f by the via conductor 3h. The capacitor conductor pattern 4f is connected to the fourth input/output terminal T4 through the via conductor 3h and the line-shaped conductor pattern 5d.

The via conductors 3a, 3b, 3i, 3j, 3k, 3l, 3m, and 3n each penetrate through two surfaces of the dielectric layer 1e opposed to each other in the height direction H.

No conductor pattern is provided on two surfaces of the dielectric layer 1e opposed to each other in the height direction H.

The via conductors 3a, 3b, 3i, 3j, 3k, 3l, 3m, and 3n each penetrate through two surfaces of the dielectric layer 1f opposed to each other in the height direction H.

No conductor pattern is provided on two surfaces of the dielectric layer 1f opposed to each other in the height direction H.

The via conductors 3a, 3b, 3i, 3j, 3k, 3l, 3m, and 3n each penetrate through two surfaces of the dielectric layer 1g opposed to each other in the height direction H.

A line-shaped conductor pattern 5e, a line-shaped conductor pattern 5f, a line-shaped conductor pattern 5g, and a line-shaped conductor pattern 5h are provided on one of two surfaces of the dielectric layer 1g opposed to each other in the height direction H. The line-shaped conductor patterns 5e to 5h each have a U-shape in plan view, and each include an arc-shaped portion and an opening-side portion including an end portion. In the line-shaped conductor patterns 5e to 5h, a direction from the arc-shaped portion toward the opening-side portion is defined as a length direction of the U-shape.

The line-shaped conductor pattern 5e is larger than the line-shaped conductor pattern 5f. The line-shaped conductor pattern 5e and the line-shaped conductor pattern 5f are aligned with each other in the length direction of the U-shape. The line-shaped conductor pattern 5f is disposed inside the line-shaped conductor pattern 5e.

The line-shaped conductor pattern 5h is larger than the line-shaped conductor pattern 5g. The line-shaped conductor pattern 5g and the line-shaped conductor pattern 5h are aligned with each other in the length direction of the U-shape. The line-shaped conductor pattern 5g is disposed inside the line-shaped conductor pattern 5h.

The arc-shaped portion of the line-shaped conductor pattern 5e and the arc-shaped portion of the line-shaped conductor pattern 5h are disposed so as to face each other.

When the multilayer body 1 is viewed in the height direction H, the line-shaped conductor pattern 5f, the line-shaped conductor pattern 5e, the line-shaped conductor pattern 5h, and the line-shaped conductor pattern 5g are disposed in this order along the length direction L of the multilayer body 1.

The line-shaped conductor pattern 5e is connected to the line-shaped conductor pattern 5a by the via conductor 3k. The line-shaped conductor pattern 5e is connected to the line-shaped conductor pattern 5b by the via conductor 3l.

The line-shaped conductor pattern 5f is connected to the capacitor conductor pattern 4h by the via conductor 3i. The line-shaped conductor pattern 5f is connected to the ground conductor pattern 2a by the via conductor 3a.

The line-shaped conductor pattern 5g is connected to the capacitor conductor pattern 4i by the via conductor 3j. The line-shaped conductor pattern 5g is connected to the ground conductor pattern 2a by the via conductor 3b.

The line-shaped conductor pattern 5h is connected to the line-shaped conductor pattern 5c by the via conductor 3m. The line-shaped conductor pattern 5h is connected to the line-shaped conductor pattern 5d by the via conductor 3n.

The via conductors 3a, 3b, 3i, 3j, 3k, 3l, 3m, and 3n each penetrate through two surfaces of the dielectric layer 1h opposed to each other in the height direction H.

A line-shaped conductor pattern 5i, a line-shaped conductor pattern 5j, a line-shaped conductor pattern 5k, and a line-shaped conductor pattern 5l are provided on one of two surfaces of the dielectric layer 1h opposed to each other in the height direction H. The line-shaped conductor patterns 5i to 5l each have a U-shape in plan view, and each include an arc-shaped portion and an opening-side portion including an end portion.

The line-shaped conductor pattern 5i is provided immediately above the line-shaped conductor pattern 5e in the height direction H, and preferably has the same or substantially the same shape and size as the line-shaped conductor pattern 5e. The line-shaped conductor pattern 5j is provided immediately above the line-shaped conductor pattern 5f in the height direction H, and preferably has the same or substantially the same shape and size as the line-shaped conductor pattern 5f. The line-shaped conductor pattern 5k is provided immediately above the line-shaped conductor pattern 5g in the height direction H, and preferably has the same or substantially the same shape and size as the line-shaped conductor pattern 5g. The line-shaped conductor pattern 5l is provided immediately above the line-shaped conductor pattern 5h in the height direction H, and preferably has the same or substantially the same shape and size as the line-shaped conductor pattern 5f.

That is, the line-shaped conductor patterns 5i, 5j, 5k, and 5l are respectively provided to overlap the line-shaped conductor patterns 5e, 5f, 5g, and 5h having the same shape and size in the height direction H.

The line-shaped conductor pattern 5*i* is connected to the line-shaped conductor pattern 5*a* by the via conductor 3*k*. The line-shaped conductor pattern 5*i* is connected to the line-shaped conductor pattern 5*b* by the via conductor 3*l*.

The line-shaped conductor pattern 5*j* is connected to the capacitor conductor pattern 4*h* by the via conductor 3*i*. The line-shaped conductor pattern 5*j* is connected to the ground conductor pattern 2*a* by the via conductor 3*a*.

The line-shaped conductor pattern 5*k* is connected to the capacitor conductor pattern 4*i* by the via conductor 3*j*. The line-shaped conductor pattern 5*k* is connected to the ground conductor pattern 2*a* by the via conductor 3*b*.

The line-shaped conductor pattern 5*l* is connected to the line-shaped conductor pattern 5*c* by the via conductor 3*m*. The line-shaped conductor pattern 5*l* is connected to the line-shaped conductor pattern 5*d* by the via conductor 3*n*.

The dielectric layer 1*i* is a protection layer.

The filter 200 has the structure described above.

Next, a relationship of the equivalent circuit and the structure of the filter 200 will be described.

The inductor L1 of the first resonant circuit RC1 includes a conductive path starting from the first input/output terminal T1, passing through the line-shaped conductor pattern 5*a*, the via conductor 3*k*, the line-shaped conductor patterns 5*e* and the via conductor 3*l*, and the line-shaped conductor pattern and ending at the second input/output terminal T2.

The capacitor C1*a* includes capacitance between the capacitor conductor pattern 4*a* and the ground conductor patterns 2*a* and 2*b*. The capacitor conductor pattern 4*a* is connected to the first input/output terminal T1 through the via conductor 3*c* and the line-shaped conductor pattern 5*a*.

The capacitor C1*b* includes capacitance between the capacitor conductor pattern 4*b* and the ground conductor patterns 2*a* and 2*c*. The capacitor conductor pattern 4*b* is connected to the second input/output terminal T2 through the via conductor 3*d* and the line-shaped conductor pattern 5*b*.

The inductor L2 of the second resonant circuit RC2 includes a conductive path starting from the capacitor conductor pattern 4*h*, passing through the via conductor 3*i*, the line-shaped conductor patterns 5*f* and 5*j*, and the via conductor 3*a*, and ending at the ground conductor pattern 2*a*.

The capacitor C2 of the second resonant circuit RC2 includes capacitance between the capacitor conductor pattern 4*c* and the ground conductor pattern 2*a*. The capacitor conductor pattern 4*c* is connected to the capacitor conductor pattern 4*h* by the via conductor 3*e*.

The inductor L3 of the third resonant circuit RC3 includes a conductive path starting from the capacitor conductor pattern 4*i*, passing through the via conductor 3*j*, the line-shaped conductor patterns 5*g* and 5*k*, and the via conductor 3*b*, and ending at the ground conductor pattern 2*a*.

The capacitor C3 of the third resonant circuit RC3 includes capacitance between the capacitor conductor pattern 4*d* and the ground conductor pattern 2*a*. The capacitor conductor pattern 4*d* is connected to the capacitor conductor pattern 4*i* by the via conductor 3*f*.

The capacitor C23 includes capacitance between the capacitor conductor patterns 4*c* and 4*h* and the capacitor conductor pattern 4*g*, and capacitance between the capacitor conductor pattern 4*g* and the capacitor conductor patterns 4*d* and 4*i*, which are connected in series.

The inductor L4 of the fourth resonant circuit RC4 includes a conductive path starting from the third input/output terminal T3, passing through the line-shaped conductor pattern 5*c*, the via conductor 3*m*, the line-shaped conductor patterns 5*h* and 5*l*, the via conductor 3*n*, and the line-shaped conductor pattern and ending at the fourth input/output terminal T4.

The capacitor C4*a* includes capacitance between the capacitor conductor pattern 4*e* and the ground conductor patterns 2*a* and 2*b*. The capacitor conductor pattern 4*e* is connected to the third input/output terminal T3 through the via conductor 3*g* and the line-shaped conductor pattern 5*c*.

The capacitor C4*b* includes capacitance between the capacitor conductor pattern 4*f* and the ground conductor patterns 2*a* and 2*c*. The capacitor conductor pattern 4*f* is connected to the fourth input/output terminal T4 through the via conductor 3*h* and the line-shaped conductor pattern 5*d*.

As described above, the filter 200 in FIG. 8 has the equivalent circuit illustrated in FIG. 7.

Figure 9A:
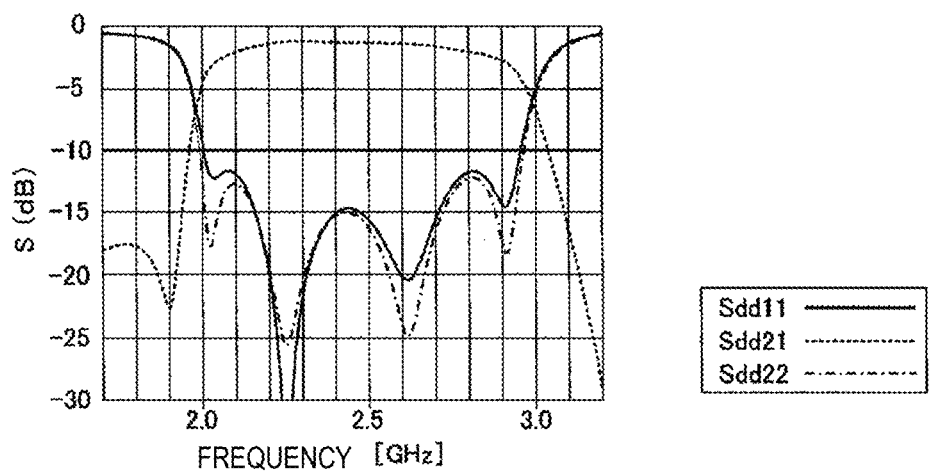
FIGS. 9A to 9C are graphs each illustrating characteristics of the filter according to the second preferred embodiment of the present invention.
Figure 9B:
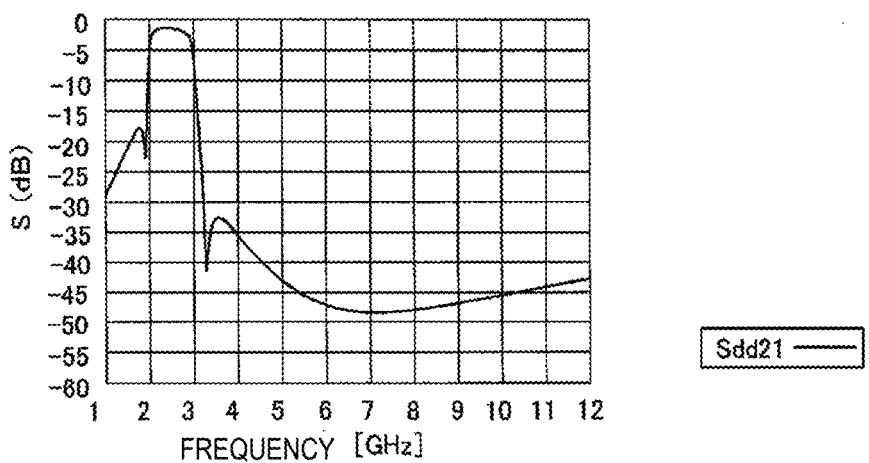
Figure 9C:
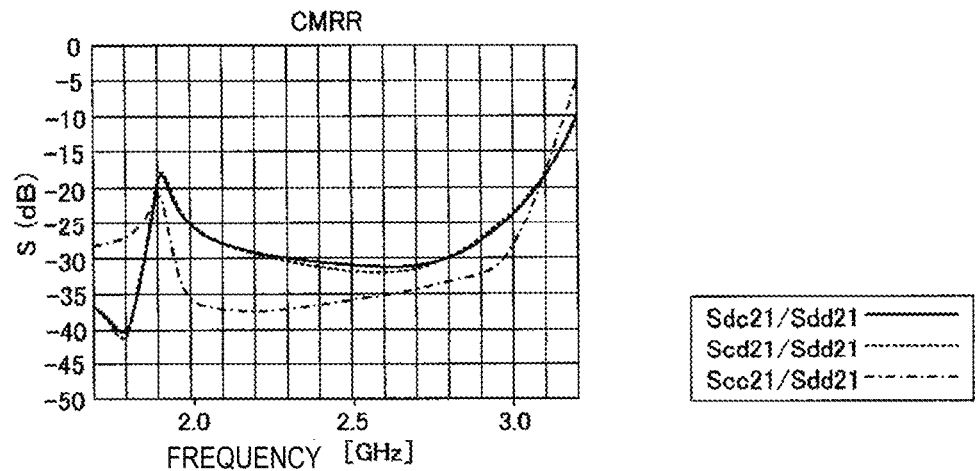

Characteristics of the filter 200 are illustrated in FIGS. 9A to 9C.

An Sdd11 characteristic, an Sdd21 characteristic, and an Sdd22 characteristic of the filter 200 are illustrated in FIG. 9A. The Sdd21 characteristic of the filter 200 over a wider frequency range is illustrated in FIG. 9B.

As can be seen from FIGS. 9A and 9B, the filter 200 has a preferable frequency characteristic as a band pass filter. Specifically, steep attenuation is obtained both on the low frequency side outside the pass band and on the high frequency side outside the pass band.

A CMRR characteristic of the filter 200 is illustrated in FIG. 9C. More specifically, an Sdc21/Sdd21 characteristic, an Scd21/Sdd21 characteristic, and an Scc21/Sdd21 characteristic of the filter 200 are illustrated.

As can be seen from the Sdc21/Sdd21 characteristic and the Scd21/Sdd21 characteristic, the filter 200 suppresses that a common-mode input signal is outputted as a differential-mode signal, or a differential-mode input signal is outputted as a common-mode signal.

Further, as can be seen from the Scc21/Sdd21 characteristic, the filter 200 preferably prevents a common-mode signal from passing through, while preferably allowing a differential-mode signal to pass through.

The filter 200 according to the second preferred embodiment has the following features.

As described above, the filter 200 preferably prevents a common-mode signal from passing through, while preferably allowing a differential-mode signal to pass through.

Since the line length of the inductor included in the intermediate stage resonant circuit is $\lambda/4$, for example, the filter 200 may be reduced in size.

In the filter 200, a small line-shaped conductor pattern with a U-shape included in the intermediate stage resonant circuit is disposed inside a large line-shaped conductor pattern with a U-shape included in the first stage resonant circuit and/or the final stage resonant circuit to be aligned with each other in the length direction of the U-shape. Thus, the surface of the dielectric layer on which the line-shaped conductor patterns are provided is effectively used. Therefore, the filter 200 may be reduced in size in planar directions (width direction×length direction).

In the filter 200, the line-shaped conductor patterns 5*e* and 5*i* included in the inductor L1 of the first resonant circuit RC1 and the line-shaped conductor patterns 5*h* and 5*l* included in the inductor L4 of the fourth resonant circuit RC4 are provided close to each other, so that the inductor L1 of the first resonant circuit RC1 and the inductor L4 of the fourth resonant circuit RC4 are magnetically coupled, and the first resonant circuit RC1 and the fourth resonant circuit RC4 are electromagnetically coupled.

Modification of Second Preferred Embodiment: Filter 210

Figure 10:
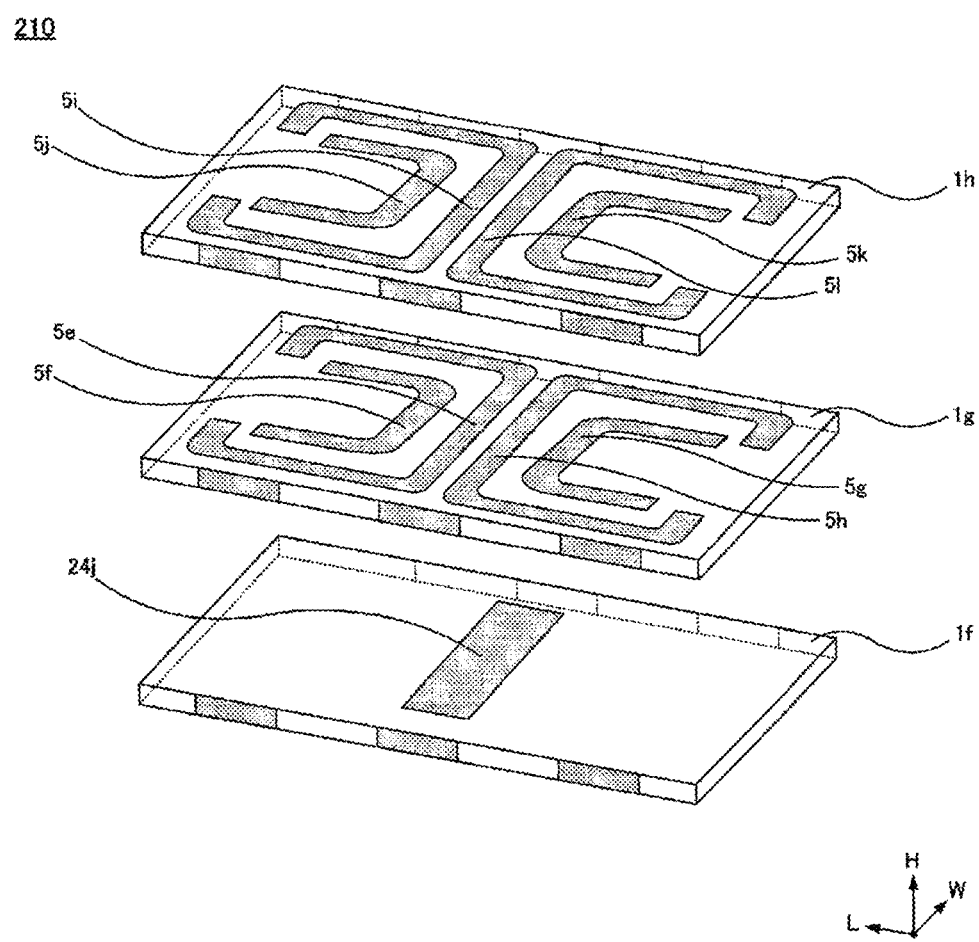
FIG. 10 is an exploded perspective view of a filter according to a modification of the second preferred embodiment of the present invention illustrating a main portion thereof.
Figure 11:
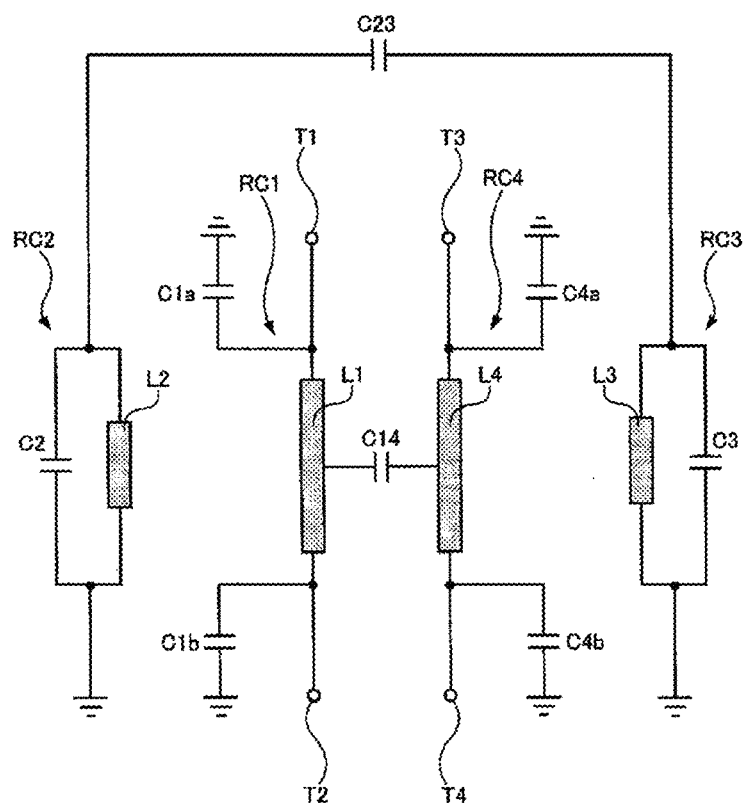
FIG. 11 is an equivalent circuit diagram of the filter according to the modification of the second preferred embodiment of the present invention.

A filter 210 according to a modification of the second preferred embodiment of the present invention is illustrated in FIG. 10 and FIG. 11. FIG. 10 is an exploded perspective view of the filter 210 illustrating a main portion thereof. FIG. 11 is an equivalent circuit diagram of the filter 210.

The filter 210 is obtained by adding a new configuration to the filter 200. Specifically, in the filter 210, a capacitor conductor pattern 24j is provided on one of two surfaces of the dielectric layer if opposed to each other in the height direction H.

In the filter 210, since the capacitor conductor pattern 24j is provided, a capacitor C14 is formed between the inductor L1 included in the first resonant circuit RC1 and the inductor L4 included in the fourth resonant circuit RC4 as illustrated in FIG. 11. That is, the capacitor C14 includes capacitance between the line-shaped conductor pattern 5e and the capacitor conductor pattern 24j, and capacitance between the capacitor conductor pattern 24j and the line-shaped conductor pattern 5h, which are connected in series.

As a result, the first resonant circuit RC1 and the fourth resonant circuit RC4 are capacitively coupled in addition to be magnetically coupled.

Figure 12A:
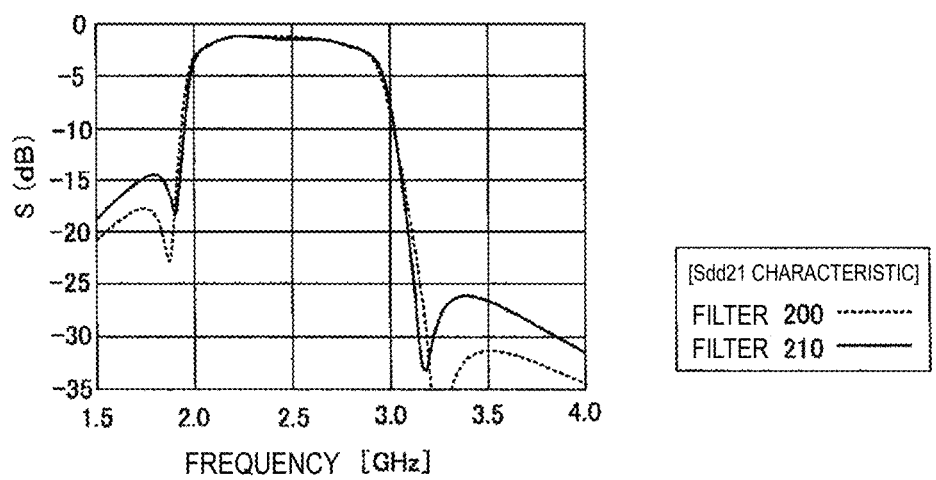
FIGS. 12A and 12B are graphs each illustrating the characteristics of the filter according to the second preferred embodiment of the present invention and the characteristics of the filter according to the modification of the second preferred embodiment of the present invention for comparison.

In FIG. 12A, the Sdd21 characteristic of the filter 200 is illustrated by a broken line, and the Sdd21 characteristic of the filter 210 is illustrated by a solid line. As can be seen from the drawing, in the filter 210, since the capacitor conductor pattern 24j is provided to capacitively couple the first resonant circuit RC1 and the fourth resonant circuit RC4, the attenuation becomes steeper on both the low frequency side and the high frequency side outside the pass band.

Figure 12B:
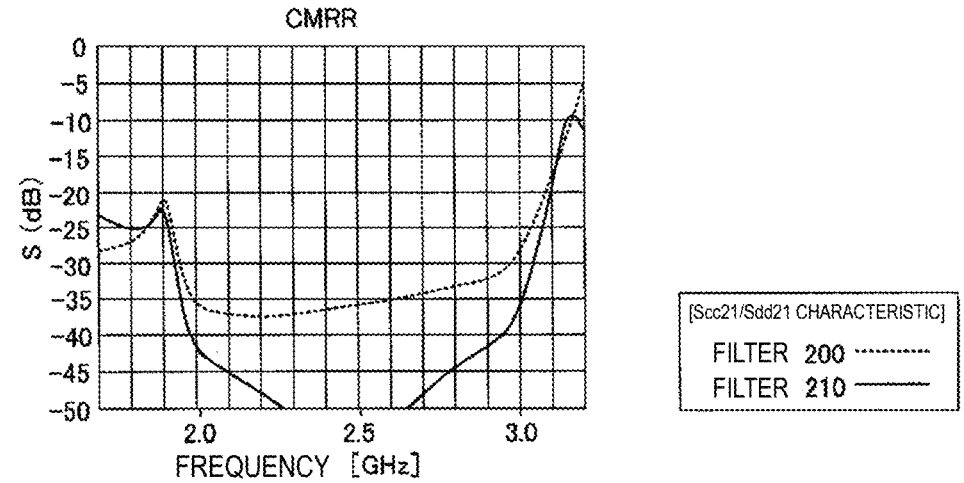

In FIG. 12B, the Scc21/Sdd21 characteristic of the filter 200 is illustrated by a broken line, and the Scc21/Sdd21 characteristic of the filter 210 is illustrated by a solid line. As can be seen from the drawing, a common-mode signal is more preferably prevented from passing through in the filter 210 than in the filter 200.

Third Preferred Embodiment

Figure 13:
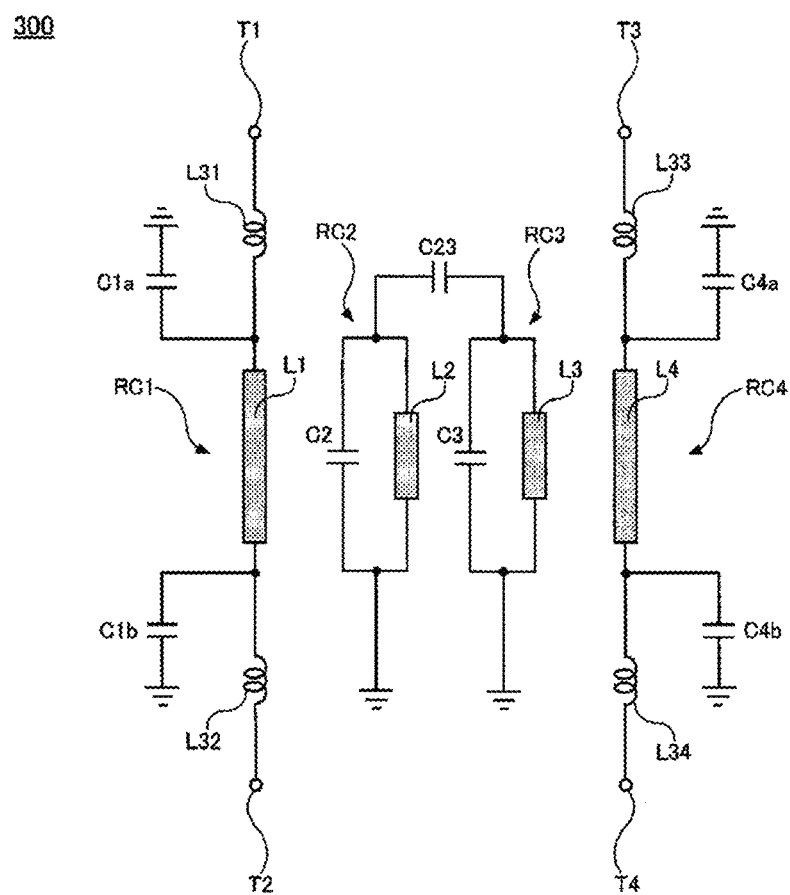
FIG. 13 is an equivalent circuit diagram of a filter according to a third preferred embodiment of the present invention.

A filter 300 according to a third preferred embodiment of the present invention is illustrated in FIG. 13. Note that FIG. 13 is an equivalent circuit diagram of the filter 300.

The filter 300 includes a first input/output terminal T1, a second input/output terminal T2, a third input/output terminal T3, and a fourth input/output terminal T4. The filter 300 includes a first resonant circuit RC1, a second resonant circuit RC2, a third resonant circuit RC3, a fourth resonant circuit RC4, an inductor L31, an inductor L32, an inductor L33, an inductor L34, and a capacitor C23.

The inductor L31, the first resonant circuit RC1, and the inductor L32 are connected in this order between the first input/output terminal T1 and the second input/output terminal T2. The first resonant circuit RC1 includes an inductor L1. In the present preferred embodiment, a line length of the inductor L1 is $\lambda/2$, for example.

A connection point of the inductors L31 and L1 is connected to a reference potential via a capacitor C1a. A connection point of the inductors L1 and L32 is connected to the reference potential via a capacitor C1b. Note that, in the filter 300, the capacitor C1c included in the filter 100 according to the above-described first preferred embodiment is omitted.

The second resonant circuit RC2 includes an inductor L2 and a capacitor C2 connected in parallel to each other. In the present preferred embodiment, a line length of the inductor L2 is $\lambda/4$, for example.

One end of the inductor L2 and one end of the capacitor C2 are connected to the reference potential.

The third resonant circuit RC3 includes an inductor L3 and a capacitor C3 connected in parallel to each other. In the present preferred embodiment, a line length of the inductor L3 is $\lambda/4$, for example.

One end of the inductor L3 and one end of the capacitor C3 are connected to the reference potential.

The other end of the inductor L2 and the other end of the capacitor C2 are connected to one end of the capacitor C23. The other end of the inductor L3 and the other end of the capacitor C3 are connected to the other end of the capacitor C23. Therefore, the inductor L2 and the capacitor C2 are connected to the inductor L3 and the capacitor C3 via the capacitor C23.

The inductor L33, the fourth resonant circuit RC4, and the inductor L34 are connected in this order between the third input/output terminal T3 and the fourth input/output terminal T4. The fourth resonant circuit RC4 includes an inductor L4. In the present preferred embodiment, a line length of the inductor L4 is $\lambda/2$, for example.

A connection point of the inductors L33 and L4 is connected to the reference potential via a capacitor C4a. A connection point of the inductors L4 and L34 is connected to the reference potential via a capacitor C4b. Note that, in the filter 300, the capacitor C4c included in the filter 100 according to the above-described first preferred embodiment is omitted.

Coupling relationships of main resonant circuits in the filter 300 will be described.

The inductor L1 of the first resonant circuit RC1 and the inductor L2 of the second resonant circuit RC2 are magnetically coupled. As a result, the first resonant circuit RC1 and the second resonant circuit RC2 are electromagnetically coupled.

The inductor L2 of the second resonant circuit RC2 and the inductor L3 of the third resonant circuit RC3 are magnetically coupled. The second resonant circuit RC2 and the third resonant circuit RC3 are capacitively coupled by the capacitance of the capacitor C23. As a result, the second resonant circuit RC2 and the third resonant circuit RC3 are electromagnetically coupled.

The inductor L3 of the third resonant circuit RC3 and the inductor L4 of the fourth resonant circuit RC4 are magnetically coupled. As a result, the third resonant circuit RC3 and the fourth resonant circuit RC4 are electromagnetically coupled.

Note that the coupling relationships of the main resonant circuits in the filter 300 have been described above, and resonant circuits may be coupled to each other in addition to the above.

The filter 300 is a multilayer type filter including a multilayer body 1 in which multiple dielectric layers 1a to 1g are laminated.

Figure 14:
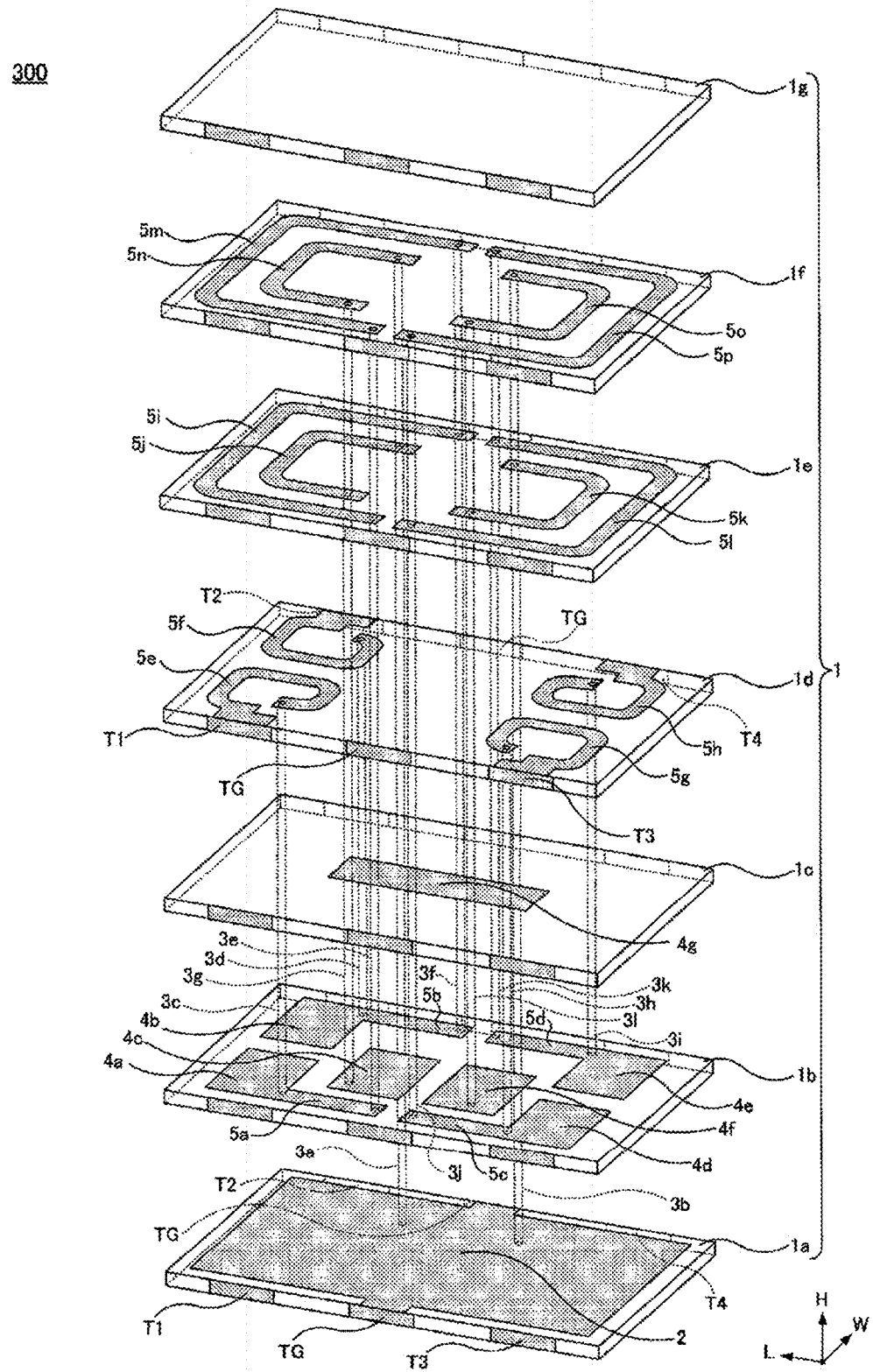
FIG. 14 is an exploded perspective view of the filter according to the third preferred embodiment of the present invention.

FIG. 14 is an exploded perspective view of the filter 300. The first input/output terminal T1, a ground terminal TG, and the third input/output terminal T3 are provided on one side surface, and the second input/output terminal T2, the ground terminal TG, and the fourth input/output terminal T4 are provided on the other side surface. The one side surface and the other side surface are opposed to each other in a width direction W of the multilayer body 1.

The configuration of the dielectric layers 1a to 1g will be described with reference to FIG. 14. The multilayer body 1 includes via conductors 3a, 3b, 3c, 3d, 3e, 3f, 3g, 3h, 3i, 3j, 3k, and 3l.

In the dielectric layer 1a, the first input/output terminal T1, the ground terminal TG, and the third input/output terminal T3 are provided on one side surface, and the second input/output terminal T2, the ground terminal TG, and the fourth input/output terminal T4 are provided on the other side surface opposed to the one side surface in the width direction W. In the dielectric layers 1b to 1g as well, the first input/output terminal T1, the ground terminal TG, and the third input/output terminal T3 are provided on one side surface, and the second input/output terminal T2, the ground terminal TG, and the fourth input/output terminal T4 are provided on the other side surface opposed to the one side surface in the width direction W.

A ground conductor pattern 2 is provided on one of two surfaces of the dielectric layer 1a opposed to each other in a height direction H. The ground conductor pattern 2 is connected to the two ground terminals TG.

The via conductors 3a and 3b each penetrate through two surfaces of the dielectric layer 1b opposed to each other in the height direction H.

Capacitor conductor patterns 4a, 4b, 4c, 4d, 4e, and 4f are provided on one of two surfaces of the dielectric layer 1b opposed to each other in the height direction H.

Line-shaped conductor patterns 5a, 5b, 5c, and 5d are provided on one of two surfaces of the dielectric layer 1b opposed to each other in the height direction H.

The line-shaped conductor pattern 5a is connected to the capacitor conductor pattern 4a. The line-shaped conductor pattern 5b is connected to the capacitor conductor pattern 4b. The line-shaped conductor pattern 5c is connected to the capacitor conductor pattern 4d. The line-shaped conductor pattern 5d is connected to the capacitor conductor pattern 4e.

The via conductors 3a, 3b, 3c, 3d, 3e, 3f, 3g, 3h, 3i, 3j, 3k, and 3l each penetrate through two surfaces of the dielectric layer 1c opposed to each other in the height direction H.

The capacitor conductor pattern 4g is provided on one of two surfaces of the dielectric layer 1c opposed to each other in the height direction H.

The via conductors 3a, 3b, 3c, 3d, 3e, 3f, 3g, 3h, 3i, 3j, 3k, and 3l each penetrate through two surfaces of the dielectric layer 1d opposed to each other in the height direction H.

Line-shaped conductor patterns 5e, 5f, 5g, and 5h are provided on one of two surfaces of the dielectric layer 1d opposed to each other in the height direction H.

The line-shaped conductor pattern 5e is connected to the first input/output terminal T1. Further, the line-shaped conductor pattern 5e is connected to the capacitor conductor pattern 4a and the line-shaped conductor pattern 5a by the via conductor 3c. The capacitor conductor pattern 4a is connected to the first input/output terminal T1 through the via conductor 3c and the line-shaped conductor pattern 5e.

The line-shaped conductor pattern 5f is connected to the second input/output terminal T2. Further, the line-shaped conductor pattern 5f is connected to the capacitor conductor pattern 4b and the line-shaped conductor pattern 5b by the via conductor 3d. The capacitor conductor pattern 4b is connected to the second input/output terminal T2 through the via conductor 3d and the line-shaped conductor pattern 5f.

The line-shaped conductor pattern 5g is connected to the third input/output terminal T3. Further, the line-shaped conductor pattern 5g is connected to the capacitor conductor pattern 4d and the line-shaped conductor pattern 5c by the via conductor 3h. The capacitor conductor pattern 4d is connected to the third input/output terminal T3 through the via conductor 3h and the line-shaped conductor pattern 5g.

The line-shaped conductor pattern 5h is connected to the fourth input/output terminal T4. Further, the line-shaped conductor pattern 5h is connected to the capacitor conductor pattern 4e and the line-shaped conductor pattern 5d by the via conductor 3i. The capacitor conductor pattern 4e is connected to the fourth input/output terminal T4 through the via conductor 3i and the line-shaped conductor patterns 5h.

The via conductors 3a, 3b, 3e, 3f, 3g, 3j, 3k, and 3l each penetrate through two surfaces of the dielectric layer 1e opposed to each other in the height direction H.

A line-shaped conductor pattern 5i, a line-shaped conductor pattern 5j, a line-shaped conductor pattern 5k, and a line-shaped conductor pattern 5l are provided on one of two surfaces of the dielectric layer 1e opposed to each other in the height direction H. The line-shaped conductor patterns 5i to 5l each have a U-shape in plan view, and each include an arc-shaped portion and an opening-side portion including an end portion. In the line-shaped conductor patterns 5i to 5j, a direction from the arc-shaped portion toward the opening-side portion is defined as a length direction of the U-shape.

The line-shaped conductor pattern 5i is larger than the line-shaped conductor pattern 5j. The line-shaped conductor pattern 5i and the line-shaped conductor pattern 5j are aligned with each other in the length direction of the U-shape. The line-shaped conductor pattern 5j is disposed inside the line-shaped conductor pattern 5i.

The line-shaped conductor pattern 5l is larger than the line-shaped conductor pattern 5k. The line-shaped conductor pattern 5k and the line-shaped conductor pattern 5l are aligned with each other in the length direction of the U-shape. The line-shaped conductor pattern 5k is disposed inside the line-shaped conductor pattern 5l.

The opening-side portion of the line-shaped conductor pattern 5j and the opening-side portion of the line-shaped conductor pattern 5k are disposed to face each other. The opening-side portion of the line-shaped conductor pattern 5i and the opening-side portion of the line-shaped conductor pattern 5l are disposed to face each other.

When the multilayer body 1 is viewed in the height direction H, the line-shaped conductor pattern 5i, the line-shaped conductor pattern 5j, the line-shaped conductor pattern 5k, and the line-shaped conductor pattern 5l are disposed in this order along a length direction L of the multilayer body 1.

The line-shaped conductor pattern 5i is connected to the line-shaped conductor pattern 5a by the via conductor 3e. The line-shaped conductor pattern 5i is connected to the line-shaped conductor pattern 5b by the via conductor 3f.

The line-shaped conductor pattern 5j is connected to the capacitor conductor pattern 4c by the via conductor 3g. The line-shaped conductor pattern 5j is connected to the ground conductor pattern 2 by the via conductors 3a.

The line-shaped conductor pattern 5k is connected to the capacitor conductor pattern 4f by the via conductor 3l. The line-shaped conductor pattern 5k is connected to the ground conductor pattern 2 by the via conductor 3b.

The line-shaped conductor pattern 5l is connected to the line-shaped conductor pattern 5c by the via conductor 3j. The line-shaped conductor pattern 5l is connected to the line-shaped conductor pattern 5d by the via conductor 3k.

The via conductors 3a, 3b, 3e, 3f, 3g, 3j, 3k, and 3l each penetrate through two surfaces of the dielectric layer if opposed to each other in the height direction H.

A line-shaped conductor pattern 5m, a line-shaped conductor pattern 5n, a line-shaped conductor pattern 5o, and a line-shaped conductor pattern 5p are provided on one of two surfaces of the dielectric layer if opposed to each other in the height direction H. The line-shaped conductor patterns 5m to 5p each have a U-shape in plan view, and each include an arc-shaped portion and an opening-side portion including an end portion.

The line-shaped conductor pattern 5m is provided immediately above the line-shaped conductor pattern 5i in the height direction H and preferably has the same or substantially the same shape and size as the line-shaped conductor pattern 5i. The line-shaped conductor pattern 5n is provided immediately above the line-shaped conductor pattern 5j in the height direction H and preferably has the same or substantially the same shape and size as the line-shaped conductor pattern 5j. The line-shaped conductor pattern 5o is provided immediately above the line-shaped conductor pattern 5k in the height direction H and preferably has the same or substantially the same shape and size as the line-shaped conductor pattern 5k. The line-shaped conductor pattern 5p is provided immediately above the line-shaped conductor pattern 5l in the height direction H and preferably has the same or substantially the same shape and size as the line-shaped conductor pattern 5l.

That is, the line-shaped conductor patterns 5m, 5n, 5o, and 5p are respectively provided to overlap the line-shaped conductor patterns 5i, 5j, 5k, and 5l having the same shape and size in the height direction H. Therefore, the filter 300 has a high Q factor. Note that the line-shaped conductor patterns 5m, 5n, 5o, and 5p may be omitted in terms of an electric circuit.

The line-shaped conductor pattern 5m is connected to the line-shaped conductor pattern 5a by the via conductor 3e. The line-shaped conductor pattern 5m is connected to the line-shaped conductor pattern 5b by the via conductor 3f.

The line-shaped conductor pattern 5n is connected to the capacitor conductor pattern 4c by the via conductor 3g. The line-shaped conductor pattern 5n is connected to the ground conductor pattern 2 by the via conductor 3a.

The line-shaped conductor pattern 5o is connected to the capacitor conductor pattern 4f by the via conductor 3l. The line-shaped conductor pattern 5o is connected to the ground conductor pattern 2 by the via conductor 3b.

The line-shaped conductor pattern 5p is connected to the line-shaped conductor pattern 5c by the via conductor 3j. The line-shaped conductor pattern 5p is connected to the line-shaped conductor pattern 5d by the via conductor 3k.

The dielectric layer 1g is a protection layer.

The filter 300 has the structure described above.

Next, a relationship of the equivalent circuit and the structure of the filter 300 will be described.

The inductor L31 includes a conductive path starting from the first input/output terminal T1 and connecting the line-shaped conductor pattern 5e and the via conductor 3c in this order.

The inductor L1 of the first resonant circuit RC1 includes a conductive path in which the line-shaped conductor pattern 5a, the via conductor 3e, the line-shaped conductor patterns 5i and 5m, the via conductor 3f, and the line-shaped conductor pattern 5b are connected in this order.

The capacitor C1a includes capacitance between the capacitor conductor pattern 4a and the ground conductor pattern 2.

The capacitor C1b includes capacitance between the capacitor conductor pattern 4b and the ground conductor pattern 2.

The inductor L32 includes a conductive path connecting the via conductor 3d and the line-shaped conductor pattern 5f in this order, and ending at the second input/output terminal T2.

The inductor L2 of the second resonant circuit RC2 includes a conductive path starting from the capacitor conductor pattern 4c, connecting the via conductor 3g, the line-shaped conductor patterns 5j and 5n, and the via conductor 3a in this order, and ending at the ground conductor pattern 2.

The capacitor C2 of the second resonant circuit RC2 includes capacitance between the capacitor conductor pattern 4c and the ground conductor pattern 2.

The inductor L3 of the third resonant circuit RC3 includes a conductive path starting from the capacitor conductor pattern 4f, connecting the via conductor 3l, the line-shaped conductor patterns 5k and 5o, and the via conductor 3b in this order, and ending at the ground conductor pattern 2.

The capacitor C3 of the third resonant circuit RC3 includes capacitance between the capacitor conductor pattern 4f and the ground conductor pattern 2.

The capacitor C23 includes capacitance between the capacitor conductor pattern 4c and the capacitor conductor pattern 4g, and capacitance between the capacitor conductor pattern 4g and the capacitor conductor pattern 4f, which are connected in series.

The inductor L33 includes a conductive path starting from the third input/output terminal T3 and connecting the line-shaped conductor pattern 5g and the via conductor 3h in this order.

The inductor L4 of the fourth resonant circuit RC4 includes a conductive path in which the line-shaped conductor pattern 5c, the via conductor 3j, the line-shaped conductor patterns 5l and 5p, the via conductor 3k, and the line-shaped conductor pattern 5d are connected in this order.

The capacitor C4a includes capacitance between the capacitor conductor pattern 4d and the ground conductor pattern 2.

The capacitor C4b includes capacitance between the capacitor conductor pattern 4e and the ground conductor pattern 2.

The inductor L34 includes a conductive path connecting the via conductor 3i and the line-shaped conductor pattern 5h in this order, and ending at the fourth input/output terminal T4.

As described above, the filter 300 in FIG. 14 has the equivalent circuit illustrated in FIG. 13.

A filter 300B was prepared for comparison with the filter 300. The filter 300B is illustrated in FIG. 15 and FIG. 16.

Figure 15:
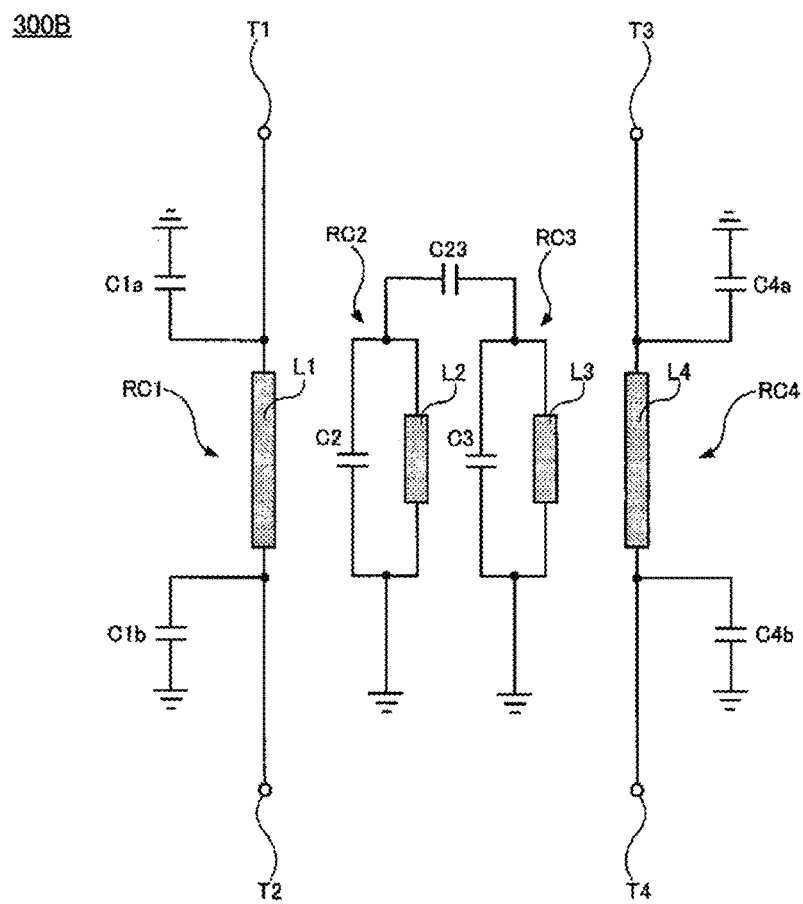
FIG. 15 is an equivalent circuit diagram of a filter prepared for comparison.

As illustrated in FIG. 15, in the filter 300B, the inductors L31, L32, L33, and L34 are omitted from the filter 300.

Figure 16:
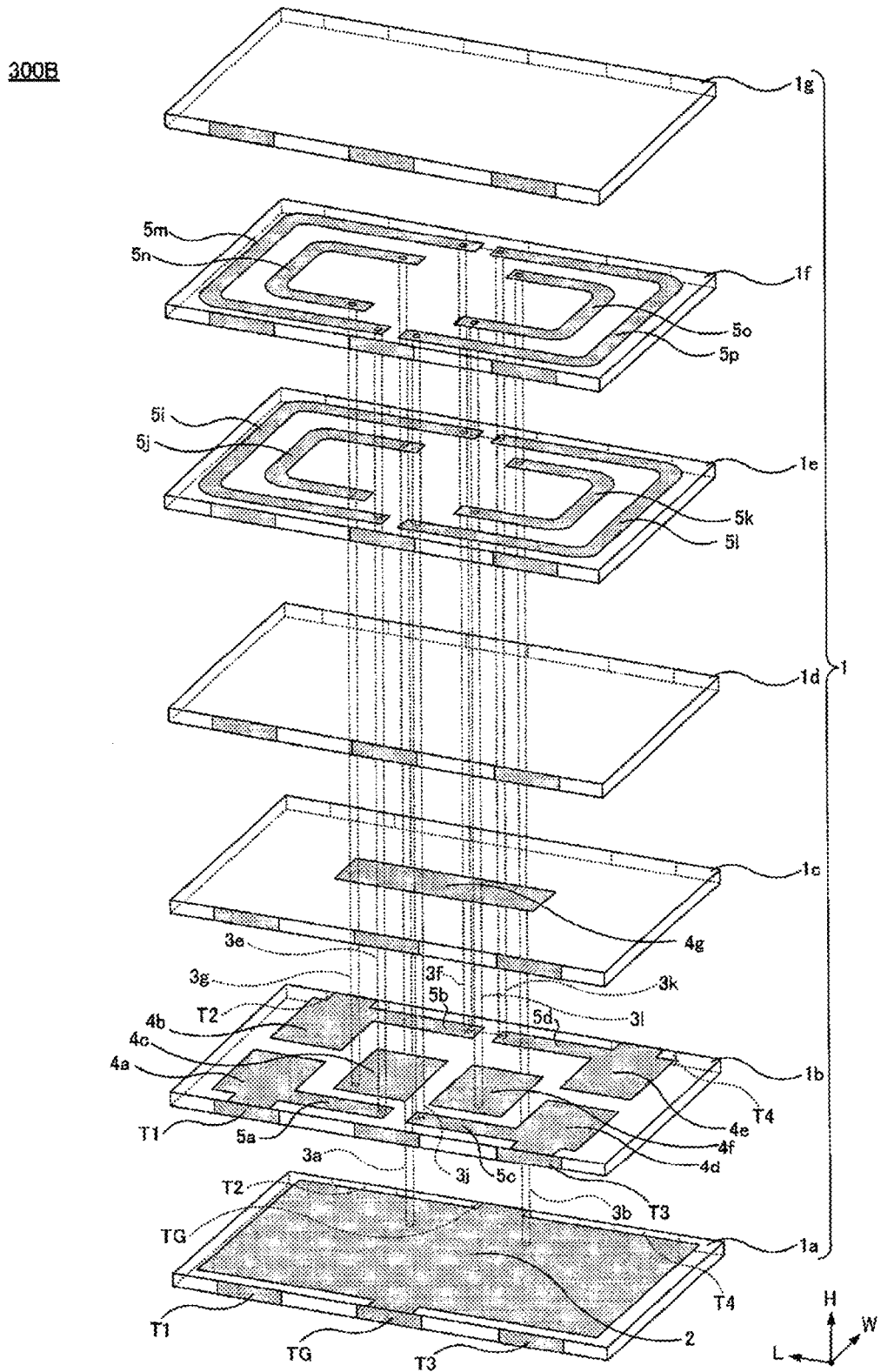
FIG. 16 is an exploded perspective view of the filter prepared for comparison.

As illustrated in FIG. 16, in the filter 300B, the line-shaped conductor patterns 5e, 5f, 5g, and 5h are omitted from the filter 300. In the filter 300B, the via conductors 3c, 3d, 3h, and 3i are omitted from the filter 300.

As illustrated in FIG. 16, in the filter 300B, the capacitor conductor pattern 4a and the line-shaped conductor pattern 5a are connected to the first input/output terminal T1, the capacitor conductor pattern 4b and the line-shaped conductor pattern 5b are connected to the second input/output terminal T2, the capacitor conductor pattern 4d and the line-shaped conductor pattern 5c are connected to the third input/output terminal T3, and the capacitor conductor pattern 4e and the line-shaped conductor pattern 5d are connected to the fourth input/output terminal T4.

Characteristics of the filter 300 are illustrated in FIGS. 17A, 17B, and FIGS. 18A to 18C.

Figure 17A:
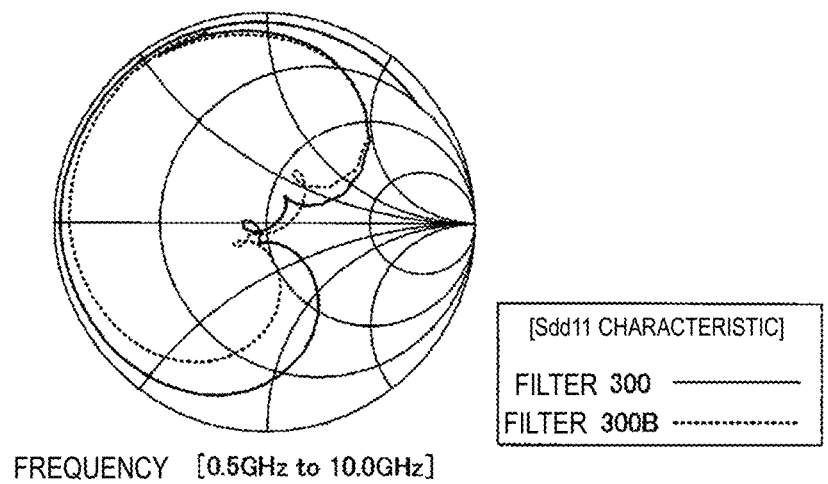
FIGS. 17A and 17B are graphs each illustrating characteristics of the filter according to the third preferred embodiment of the present invention.

An Sdd11 characteristic of the filter 300 is illustrated by a solid line in FIG. 17A. For comparison, an Sdd11 characteristic of the filter 300B is illustrated by a broken line in FIG. 17A.

Figure 17B:
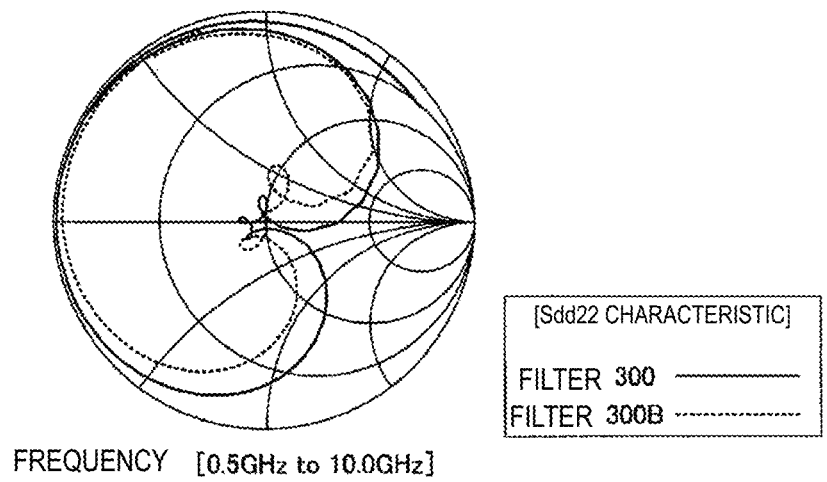

An Sdd22 characteristic of the filter 300 is illustrated by a solid line in FIG. 17B. For comparison, an Sdd22 characteristic of the filter 300B is illustrated by a broken line in FIG. 17B.

Figure 18A:
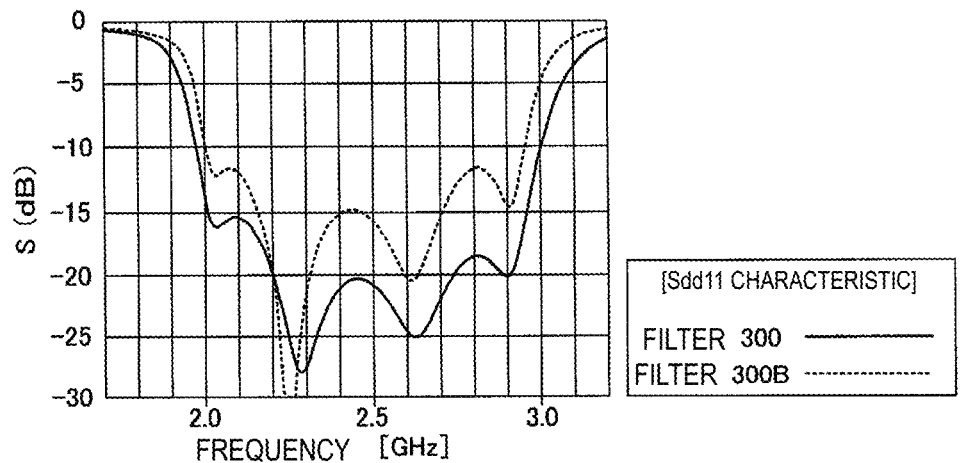
FIGS. 18A to 18C are graphs each illustrating characteristics of the filter according to the third preferred embodiment of the present invention.

The Sdd11 characteristic of the filter 300 is illustrated by a solid line in FIG. 18A. For comparison, the Sdd11 characteristic of the filter 300B is illustrated by a broken line in FIG. 18A.

Figure 18B:
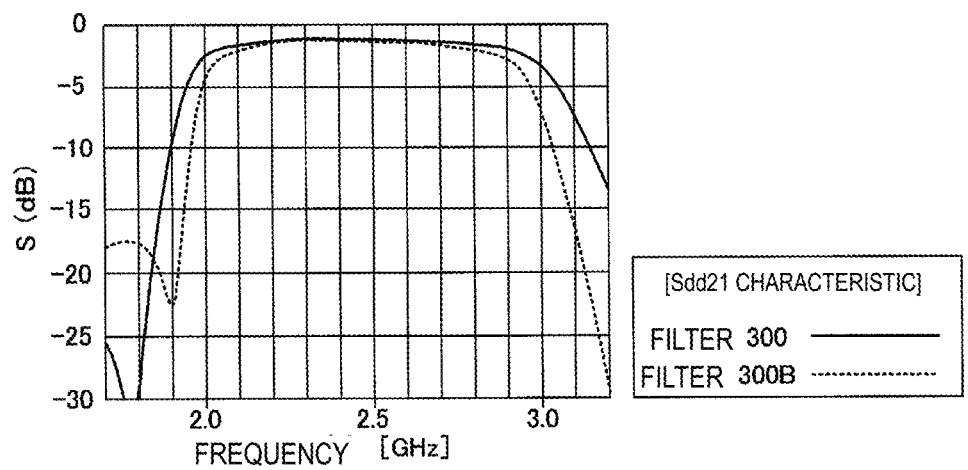

An Sdd21 characteristic of the filter 300 is illustrated by a solid line in FIG. 18B. For comparison, an Sdd21 characteristic of the filter 300B is illustrated by a broken line in FIG. 18B.

Figure 18C:
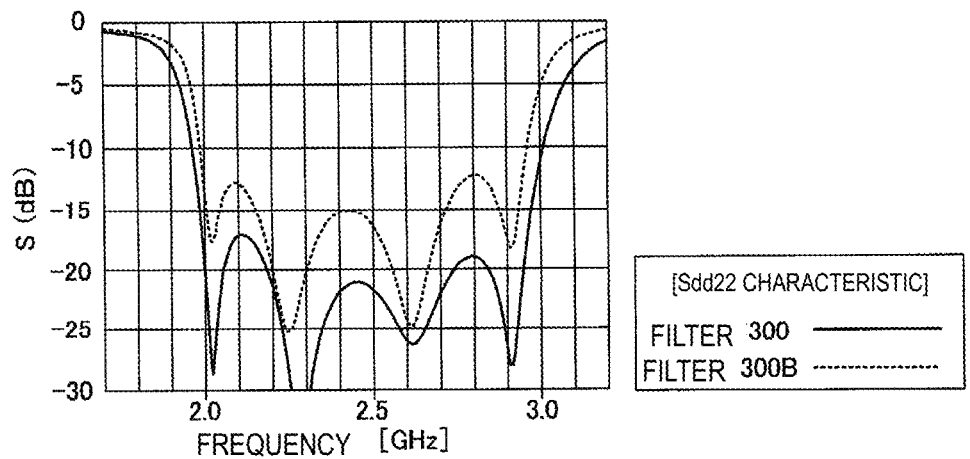

The Sdd22 characteristic of the filter 300 is illustrated by a solid line in FIG. 18C. For comparison, the Sdd22 characteristic of the filter 300B is illustrated by a broken line in FIG. 18C.

As can be seen from FIGS. 17A and 17B, since the filter 300 includes the inductors L31, L32, L33, and L34, the impedance of the input/output portion is shifted to a high side as a whole in comparison with that in the filter 300B, and impedance matching is possible in a wide frequency range. The impedance of the input/output portion of the filter 300 is converged to 50Ω in a pass band range.

As can be seen from FIGS. 18A to 18C, since the filter 300 includes the inductors L31, L32, L33, and L34, the return loss is improved in comparison with that in the filter 300B.

Since the filter 300 according to the third preferred embodiment includes the inductors L31, L32, L33, and L34, the impedance of the input/output portion is preferably adjusted. Further, since the filter 300 includes the inductors L31, L32, L33, and L34, the return loss is improved.

The filter 300 preferably prevents a common-mode signal from passing through, while preferably allowing a differential-mode signal to pass through. Further, since the line length of the inductor included in the intermediate stage resonant circuit is λ/4, for example, the filter 300 may be reduced in size.

The first preferred embodiment, the modification of the first preferred embodiment, the second preferred embodiment, the modification of the second preferred embodiment, and the third preferred embodiment have been described above. However, the present invention is not limited to the contents described above, and various modifications can be made within the spirit of the invention.

For example, although the filter preferably is a four stage filter including four resonant circuits in the above-described preferred embodiments, the number of stages is not limited to four. A balanced input/output filter may have three stages or five or more stages.

Although the second resonant circuit RC2 and the third resonant circuit RC3 preferably are capacitively coupled to each other by the capacitor C23 in the above preferred embodiments, the capacitor C23 may be omitted when other conditions permit. Filters according to preferred embodiments of the present invention may be as described above.

In the filters above, it is preferable as well that a line length of the inductor of the intermediate stage resonant circuit be shorter than a line length of the inductor of at least one of the first stage resonant circuit and the final stage resonant circuit. In the case above, it is possible to reduce the intermediate stage resonant circuit in size and to reduce the filter in size.

It is preferable as well that the line length of the inductor of the at least one of the first stage resonant circuit and the final stage resonant circuit be λ/2, and the line length of the inductor of the intermediate stage resonant circuit be λ/4, for example. In the case above, it is possible to reduce the intermediate stage resonant circuit in size and to reduce the filter in size.

It is preferable as well that the intermediate stage resonant circuit include a second stage resonant circuit and a third stage resonant circuit. In the case above, it is possible to reduce the filter of four or more stages in size.

It is preferable as well that the intermediate stage resonant circuit include two or more intermediate stage resonant circuits, and inductors of the two or more intermediate stage resonant circuits be connected to each other and connected to the reference potential. In the case above, the magnetic coupling of the intermediate stage resonant circuits to each other may be made strong.

It is preferable as well that the inductor of the first stage resonant circuit and the inductor of the final stage resonant circuit be connected to each other via a capacitor. In the case above, the first stage resonant circuit and the final stage resonant circuit may capacitively be coupled.

It is preferable as well that an inductor be provided at least one of between the first input/output terminal and the first stage resonant circuit, between the second input/output terminal and the first stage resonant circuit, between the third input/output terminal and the final stage resonant circuit, and between the fourth input/output terminal and the final stage resonant circuit. Further, it is preferable as well that an inductor be provided each of between the first input/output terminal and the first stage resonant circuit, between the second input/output terminal and the first stage resonant circuit, between the third input/output terminal and the final stage resonant circuit, and between the fourth input/output terminal and the final stage resonant circuit. In the cases above, the impedance of the input/output portion may preferably be adjusted. Further, return loss may be improved.

It is preferable as well that a multilayer body in which multiple dielectric layers are laminated and on an outer surface of which the first input/output terminal, the second input/output terminal, the third input/output terminal, and the fourth input/output terminal are provided and line-shaped conductor patterns provided to the dielectric layers be further included and that at least part of the inductor of each of the first stage resonant circuit, the final stage resonant circuit, and the intermediate stage resonant circuit include one of the line-shaped conductor patterns, and the line-shaped conductor pattern of at least one of the first stage resonant circuit and the final stage resonant circuit and the line-shaped conductor pattern of the intermediate stage resonant circuit be provided to the same dielectric layer of the multilayer body. In the case above, the inductor of at least one of the first stage resonant circuit and the final stage resonant circuit and the inductor of the intermediate stage resonant circuit may preferably magnetically be coupled.

It is preferable as well that, in the line-shaped conductor patterns provided to the same dielectric layer of the multilayer body, the line-shaped conductor pattern of the at least one of the first stage resonant circuit and the final stage resonant circuit be a line-shaped conductor pattern with a U-shape, and the line-shaped conductor pattern of the intermediate stage resonant circuit be a line-shaped conductor pattern with a U-shape. The line-shaped conductor pattern with a U-shape may have an arc-shaped portion and an opening-side portion including an end portion, and a direction from the arc-shaped portion toward the opening-side portion may be defined as a length direction of a U-shape. The line-shaped conductor pattern of the at least one of the first stage resonant circuit and the final stage resonant circuit may be larger than the line-shaped conductor pattern of the intermediate stage resonant circuit, and the line-shaped conductor pattern of the at least one of the first stage resonant circuit and the final stage resonant circuit and the line-shaped conductor pattern of the intermediate stage resonant circuit may be aligned with each other in the length direction of a U-shape. In the case above, since an upper main surface of a dielectric layer on which line-shaped conductor patterns above are formed may effectively be used, a filter may be reduced in size in planar directions (width direction×length direction).

It is preferable as well that the intermediate stage resonant circuit include a second stage resonant circuit and a third stage resonant circuit, the line-shaped conductor pattern of each of the first stage resonant circuit, the second stage resonant circuit, the third stage resonant circuit, and the final stage resonant circuit be provided to the same dielectric layer of the multilayer body. With respect to the line-shaped conductor pattern with a U-shape of the first stage resonant circuit and the line-shaped conductor pattern with a U-shape of the second stage resonant circuit, the line-shaped conductor pattern with a U-shape of the second stage resonant circuit may be disposed inside the line-shaped conductor pattern with a U-shape of the first stage resonant circuit to be aligned with each other in the length direction of a U-shape. With respect to the line-shaped conductor pattern with a U-shape of the final stage resonant circuit and the line-shaped conductor pattern with a U-shape of the third stage resonant circuit, the line-shaped conductor pattern with a U-shape of the third stage resonant circuit may be disposed inside the line-shaped conductor pattern with a U-shape of the final stage resonant circuit to be aligned with each other in the length direction of a U-shape. In the case above, in a filter having four or more stages, an upper main surface of a dielectric layer on which a line-shaped conductor pattern is formed may effectively be used, and the filter may be reduced in size in planar directions (width direction× length direction).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter, comprising:
a first input/output terminal;
a second input/output terminal;
a third input/output terminal;
a fourth input/output terminal;
a first stage resonant circuit connected between the first input/output terminal and the second input/output terminal;
at least one intermediate stage resonant circuit; and
a final stage resonant circuit connected between the third input/output terminal and the fourth input/output terminal; wherein
the first stage resonant circuit and the final stage resonant circuit each include an inductor;
the at least one intermediate stage resonant circuit includes an inductor and a capacitor connected in parallel to each other, and one end of the inductor and one end of the capacitor connected in parallel to the inductor are connected to a reference potential; and
at least two of the first stage resonant circuit, the at least one intermediate stage resonant circuit, and the final stage resonant circuit are coupled to each other.

2. The filter according to claim 1, wherein a line length of the inductor of the at least one intermediate stage resonant circuit is shorter than a line length of the inductor of at least one of the first stage resonant circuit and the final stage resonant circuit.

3. The filter according to claim 2, wherein
the line length of the inductor of the at least one of the first stage resonant circuit and the final stage resonant circuit is $\lambda/2$; and
the line length of the inductor of the at least one intermediate stage resonant circuit is $\lambda/4$.

4. The filter according to claim 1, wherein the at least one intermediate stage resonant circuit includes a second stage resonant circuit and a third stage resonant circuit.

5. The filter according to claim 1, wherein
the at least one intermediate stage resonant circuit includes two or more intermediate stage resonant circuits; and
inductors of the two or more intermediate stage resonant circuits are connected to each other and are connected to the reference potential.

6. The filter according to claim 5, further comprising a common via conductor connecting the inductors of the two or more intermediate stage resonant circuits to ground.

7. The filter according to claim 1, wherein an inductor is provided at least one of between the first input/output terminal and the first stage resonant circuit, between the second input/output terminal and the first stage resonant circuit, between the third input/output terminal and the final stage resonant circuit, and between the fourth input/output terminal and the final stage resonant circuit.

8. The filter according to claim 7, wherein an inductor is provided each of between the first input/output terminal and the first stage resonant circuit, between the second input/output terminal and the first stage resonant circuit, between the third input/output terminal and the final stage resonant circuit, and between the fourth input/output terminal and the final stage resonant circuit.

9. The filter according to claim 1, further comprising:
a multilayer body in which multiple dielectric layers are laminated and on an outer surface of which the first input/output terminal, the second input/output terminal, the third input/output terminal, and the fourth input/output terminal are provided; and
line-shaped conductor patterns provided to the dielectric layers; wherein
at least a portion of the inductor of each of the first stage resonant circuit, the final stage resonant circuit, and the at least one intermediate stage resonant circuit includes one of the line-shaped conductor patterns; and
the line-shaped conductor pattern of at least one of the first stage resonant circuit and the final stage resonant circuit; and
the line-shaped conductor pattern of the at least one intermediate stage resonant circuit are provided to a same dielectric layer of the multilayer body.

10. The filter according to claim 9, wherein in the line-shaped conductor patterns provided to the same dielectric layer of the multilayer body:

the line-shaped conductor pattern of the at least one of the first stage resonant circuit and the final stage resonant circuit is a line-shaped conductor pattern with a U-shape;

the line-shaped conductor pattern of the at least one intermediate stage resonant circuit is a line-shaped conductor pattern with a U-shape;

the line-shaped conductor pattern with a U-shape includes an arc-shaped portion and an opening-side portion including an end portion, and a direction from the arc-shaped portion toward the opening-side portion is defined as a length direction of a U-shape;

the line-shaped conductor pattern of the at least one of the first stage resonant circuit and the final stage resonant circuit is larger than the line-shaped conductor pattern of the at least one intermediate stage resonant circuit; and the line-shaped conductor pattern of the at least one of the first stage resonant circuit and the final stage resonant circuit and the line-shaped conductor pattern of the at least one intermediate stage resonant circuit are aligned with each other in the length direction of a U-shape.

11. The filter according to claim 10, wherein the at least one intermediate stage resonant circuit includes a second stage resonant circuit and a third stage resonant circuit;

the line-shaped conductor pattern of the first stage resonant circuit, a line-shaped conductor pattern of the second stage resonant circuit, a line-shaped conductor pattern of the third stage resonant circuit, and the line-shaped conductor pattern of the final stage resonant circuit are provided to a same dielectric layer of the multilayer body;

with respect to the line-shaped conductor pattern with a U-shape of the first stage resonant circuit and the line-shaped conductor pattern with a U-shape of the second stage resonant circuit, the line-shaped conductor pattern with a U-shape of the second stage resonant circuit is inside the line-shaped conductor pattern with a U-shape of the first stage resonant circuit to be aligned with each other in the length direction of a U-shape; and with respect to the line-shaped conductor pattern with a U-shape of the final stage resonant circuit and the line-shaped conductor pattern with a U-shape of the third stage resonant circuit, the line-shaped conductor pattern with a U-shape of the third stage resonant circuit is inside the line-shaped conductor pattern with a U-shape of the final stage resonant circuit to be aligned with each other in the length direction of a U-shape.

12. The filter according to claim 1, wherein at least two of the first stage resonant circuit, the at least one intermediate stage resonant circuit, and the final stage resonant circuit are magnetically coupled to each other.

13. The filter according to claim 1, wherein at least two of the first stage resonant circuit, the at least one intermediate stage resonant circuit, and the final stage resonant circuit are capacitively coupled to each other.

14. The filter according to claim 1, wherein at least two of the first stage resonant circuit, the at least one intermediate stage resonant circuit, and the final stage resonant circuit are electromagnetically coupled to each other.

15. The filter according to claim 1, wherein the inductor of the first stage resonant circuit and the inductor of the final stage resonant circuit are connected to each other via a capacitor.

16. The filter according to claim 1, wherein the filter includes a total of four resonant circuits.

17. The filter according to claim 16, wherein at least two of the four resonant circuits are magnetically coupled to each other.

18. The filter according to claim 16, wherein at least two of the four resonant circuits are capacitively coupled to each other.

19. The filter according to claim 16, wherein at least two of the four resonant circuits are electromagnetically coupled to each other.

* * * * *